US012757767B2

(12) United States Patent
Xiang et al.

(10) Patent No.: US 12,757,767 B2
(45) Date of Patent: Oct. 6, 2026

(54) CHIPLET-FINE-INTERCONNECTION-PACKAGE STRUCTURE AND METHOD OF MANUFACTURING THE SAME

(71) Applicant: INSTITUTE OF SEMICONDUCTORS, GUANGDONG ACADEMY OF SCIENCES, Guangzhou (CN)

(72) Inventors: Xun Xiang, Guangzhou (CN); Chuan Hu, Guangzhou (CN); Yingqiang Yan, Guangzhou (CN); Yunzhi Ling, Guangzhou (CN); Zhikuan Chen, Guangzhou (CN); Zhitao Chen, Guangzhou (CN)

(73) Assignee: INSTITUTE OF SEMICONDUCTORS, GUANGDONG ACADEMY OF SCIENCES, Guangzhou (CN)

( * ) Notice: Subject to any disclaimer, the term of this patent is extended or adjusted under 35 U.S.C. 154(b) by 399 days.

(21) Appl. No.: 18/503,950

(22) Filed: Nov. 7, 2023

(65) Prior Publication Data

US 2024/0304556 A1 Sep. 12, 2024

(30) Foreign Application Priority Data

Mar. 10, 2023 (CN) ........................ 202310226006.X

(51) Int. Cl.
*H10W 70/65* (2026.01)
*H10W 70/60* (2026.01)
(Continued)

(52) U.S. Cl.
CPC ......... *H10W 70/65* (2026.01); *H10W 70/685* (2026.01); *H10W 74/012* (2026.01);
(Continued)

(58) Field of Classification Search
CPC . H10W 70/65; H10W 70/685; H10W 74/012; H10W 74/15; H10W 90/00;
(Continued)

(56) References Cited

U.S. PATENT DOCUMENTS 6,383,846 B1 * 5/2002 Shen .................. H10W 74/016 257/E23.125
2015/0171015 A1 * 6/2015 Mahajan ............... H10W 70/65 257/774
(Continued)

FOREIGN PATENT DOCUMENTS

CN 110707075 A 1/2020
CN 111357102 A 6/2020
(Continued)

*Primary Examiner* — Herve-Louis Y Assouman
(74) *Attorney, Agent, or Firm* — INNOVATION CAPITAL LAW GROUP, LLP; Vic Lin

(57) ABSTRACT

Disclosed is a method of manufacturing a chiplet-fine-interconnection-package structure, comprising: mounting at least two chips on a first side surface of a substrate and preparing a temporary bonding layer on the chips, preparing a plastic package layer on a second side surface of the substrate, wherein the substrate is prepared with microvias to allow plastic package materials to flow from the microvias into an area between the first side surface of the substrate and the temporary bonding layer to prepare the plastic package layer; releasing the temporary bonding layer, and bonding a silicon bridge structure on the first pin-arrays of the two adjacent chips. The solution provided by the present invention makes it unnecessary to remove the substrate in the subsequent process and to perform grinding and thinning process on the corresponding position of the plastic package layer, thus simplifying the packaging process steps and reducing the packaging cost.

20 Claims, 14 Drawing Sheets

(51) Int. Cl.

| | |
|---|---|
| ***H10W 70/685*** | (2026.01) |
| ***H10W 72/00*** | (2026.01) |
| ***H10W 72/20*** | (2026.01) |
| ***H10W 72/30*** | (2026.01) |
| ***H10W 72/90*** | (2026.01) |
| ***H10W 74/01*** | (2026.01) |
| ***H10W 74/15*** | (2026.01) |
| ***H10W 90/00*** | (2026.01) |
| *H10W 74/10* | (2026.01) |

(52) U.S. Cl.
CPC ........... *H10W 74/15* (2026.01); *H10W 90/00* (2026.01); *H10W 90/701* (2026.01); *H10W 72/321* (2026.01); *H10W 72/344* (2026.01); *H10W 72/921* (2026.01); *H10W 72/923* (2026.01); *H10W 72/942* (2026.01); *H10W 74/142* (2026.01)

(58) Field of Classification Search
CPC ............ H10W 90/701; H10W 72/321; H10W 72/344; H10W 72/921; H10W 72/923; H10W 72/942; H10W 74/142; H10W 70/611; H10W 72/072; H10W 72/20; H10W 72/30; H10W 72/90; H10W 90/401
See application file for complete search history.

(56) References Cited

U.S. PATENT DOCUMENTS

| | | | | |
|---|---|---|---|---|
| 2020/0020633 | A1 | 1/2020 | Chang et al. | |
| 2020/0258847 | A1 * | 8/2020 | Pietambaram ...... | H10W 42/121 |

FOREIGN PATENT DOCUMENTS

| | | | |
|---|---|---|---|
| CN | 112385024 | A | 2/2021 |
| CN | 113785393 | A | 12/2021 |
| CN | 114664759 | A | 6/2022 |
| CN | 114937608 | A | 8/2022 |

* cited by examiner

CHIPLET-FINE-INTERCONNECTION-PACKAGE STRUCTURE AND METHOD OF MANUFACTURING THE SAME

FIELD OF THE INVENTION

The present invention relates to the technical field of integrated circuit packaging, and more particularly relates to a chiplet-fine-interconnection-package structure and a method of manufacturing the same.

BACKGROUND OF THE INVENTION

The development of technologies such as 5G, the Internet of Things (IoT), artificial intelligence (AI), and high-performance computing has led to a boom of high-end applications that require semiconductor chips having higher data transmission and more advanced computing capabilities. In order to meet the high-performance requirements of these high-end application fields, in the semiconductor chip manufacturing process, it is often necessary to integrate one or more integrated circuit chips/dies onto the same package substrate to form a highly integrated package, thereby enabling the highly integrated package to provide chip functions that meet the requirements and expectations of high-end application fields.

With the gradual development of high-end application fields, integrating more integrated circuit chips/dies into a smaller space and achieving interconnections between chips/dies with shorter distances is in line with expectations. For this reason, 2.5D/3D advanced packaging technologies that can achieve higher integration and higher-density component interconnections have gained widespread attention. Among these advanced packaging technologies, embedded silicon bridge packaging has become a mainstream advanced packaging solution because of its ability to achieve the optimal balance between chip performance and packaging cost, wherein the embedded silicon bridge packaging can use the silicon bridge structure as the interconnection layer to achieve interconnections between two or more integrated circuit chips/dies. However, the silicon bridge structure of the embedded silicon bridge packaging is performed in an embedded manner, and the silicon bridge structure needs to be embedded into an organic substrate, thus the interconnection density and chip integration capability thereof are limited, and the packaging cost is still relatively high. It is clear that in order to meet the requirements for higher performance in high-end application fields, the implementation of low packaging cost, small package size, higher interconnection density, and higher integration capability of silicon bridge packaging on a limited-size silicon bridge structure has become a new challenge for a person of ordinary skill in the art to face and to solve.

SUMMARY OF THE INVENTION

An embodiment of the present invention provides a new packaging solution based on the silicon bridge structure to further reduce the packaging cost and improve the integration capability of the package structure while ensuring a relatively small package size.

In a first aspect, an embodiment of the present invention provides a method of manufacturing a chiplet-fine-interconnection-package structure, comprising: mounting at least two chips on a first side surface of a substrate and preparing a temporary bonding layer on a first surface of each one of the at least two chips, wherein the first surface of each chip includes a first pin-array having a first spacing and a second pin-array having a second spacing; preparing a plastic package layer on a second side surface of the substrate, wherein the substrate is prepared with microvias to allow plastic package materials of the plastic package layer to flow from the microvias into an area between the first side surface of the substrate and the temporary bonding layer to prepare the plastic package layer which covers the substrate and the chips; releasing the temporary bonding layer, and bonding a silicon bridge structure for electrically connecting the two adjacent chips on the first pin-arrays of the two adjacent chips; and preparing a build-up layer on the plastic package layer and preparing a solder bump on the build-up layer such that the solder bump is electrically connected with the second pin-array through the build-up layer.

In a second aspect, an embodiment of the present invention provides another method of manufacturing a chiplet-fine-interconnection-package structure, comprising: mounting at least two chips on a first side surface of a substrate, wherein each chip includes a first pin-array having a first spacing and a second pin-array having a second spacing; bonding a silicon bridge structure for electrically connecting the two adjacent chips on the first pin-arrays of the two adjacent chips; preparing a temporary bonding layer on the silicon bridge structure; preparing a plastic package layer on a second side surface of the substrate, wherein the substrate is prepared with microvias to allow plastic package materials of the plastic package layer to flow from the microvias into an area between the first side surface of the substrate and the temporary bonding layer to prepare the plastic package layer which covers the substrate, the chips and the silicon bridge structure; releasing the temporary bonding layer; and preparing on the plastic package layer a solder bump electrically connected with the second pin-array through the plastic package layer, or preparing a build-up layer on the plastic package layer and preparing the solder bump electrically connected with the second pin-array through the plastic package layer and the build-up layer on the build-up layer.

In a third aspect, an embodiment of the present invention provides a chiplet-fine-interconnection-package structure, comprising: a substrate with microvias; at least two chips attached to a first side surface of the substrate, wherein each chip includes a first pin-array having a first spacing and a second pin-array having a second spacing; a plastic package layer, wherein the microvias are filled with a plastic package material of the plastic package layer; a silicon bridge structure bonded on the first pin-arrays of the two adjacent chips; a build-up layer disposed on the plastic package layer; and a solder bump arranged on the build-up layer, wherein the solder bump is electrically connected to the second pin-array through the build-up layer or the build-up layer and the plastic package layer.

In a fourth aspect, an embodiment of the present invention provides another chiplet-fine-interconnection-package structure, comprising: a substrate with microvias; at least two chips attached to a first side surface of the substrate, wherein each chip includes a first pin-array having a first spacing and a second pin-array having a second spacing; a silicon bridge structure bonded on the first pin-arrays of the two adjacent chips; a plastic package layer including a plastic package material, a second interconnect electrically interconnected with a second pin-array of the chip, and a fifth pin-array electrically conducted with the second interconnect, the second interconnect being located in the plastic package material, the fifth pin-array being at least partially exposed to a surface of the plastic package material, the microvias being filled with the plastic package material; and a solder bump arranged on the fifth pin-array of the plastic package layer.

In a fifth aspect, an embodiment of the present invention provides a chiplet-fine-interconnection-package structure manufactured by the method described in the first or second aspect of the embodiments of the present invention.

The beneficial effect of the embodiments of the present invention is that: the solution provided by the embodiments of the present invention prepares the microvias on the substrate in advance, and prepares the temporary bonding layer on the chip attached to the substrate or the silicon bridge structure bonded on the chip, enabling the preparation of the plastic package layer from the second side surface of the substrate, i.e., the side where the chip is not attached. Therefore, in the solution of the embodiments of the present invention, it is possible to prepare the temporary bonding layer prior to the plastic package layer through the mutual cooperation of the microvias and the temporary bonding layer so that in the process of preparing the plastic package layer, the temporary bonding layer can provide protection for the first surface of the chip (i.e., the chip surface prepared with the first pin-array and the second pin-array bonded with the temporary bonding layer, which is also referred to as the front side of the chip in the embodiments of the present invention) and the first silicon bridge surface of the silicon bridge structure (i.e., the surface of the silicon bridge prepared with the temporary bonding layer and not bonded to the first pin-array of the chip, which is also referred to as the back side of the silicon bridge in the embodiments of the present invention). Accordingly the prepared plastic package layer will not cover the first pin-array, the second pin-array and the silicon bridge structure. In such packaging method, in the subsequent process, the solution of the embodiments of the present invention does not need to perform a grinding and thinning process on the corresponding position of the plastic package layer as in the prior art, and thus such packaging method not only achieves the fine interconnection between the chips through the silicon bridge structure, but also effectively improves the reliability of the package structure, simplifies the packaging process steps, and reduces the packaging cost. Meanwhile, through the solution of the present invention to prepare the package structure, the substrate is firmly fixed in the package structure as a permanent substrate through the plastic package layer, so it is no longer necessary to peel off the substrate in the subsequent process, and thus the substrate can provide better mechanical strength support for the package structure, which further ensures the reliability of the package structure and simplifies the packaging process steps. In addition, the solution of the embodiments of the present invention also achieves an electrical connection between the first pin-arrays having a narrower spacing (i.e., higher density) of the chips through the silicon bridge structure, enabling higher-density fine interconnection between the chips; and the second pin-arrays having a wider spacing (i.e., lower density) between the chips in the embodiments of the present invention are electrically connected to external components through other interconnects in the build-up layer or the plastic package layer, which ensures that the silicon bridge structure in this solution is used only for the high-density fine interconnection between the chips, thus also enabling the silicon bridge structure to be more fully utilized and the size to be made as small as possible. Therefore, the solution of the embodiments of the present invention not only reduces the packaging cost but also further reduces the package size and helps to improve the integration capability of the chiplet.

BRIEF DESCRIPTION OF THE DRAWINGS

In order to illustrate the technical solutions of the embodiments of the present invention more clearly, the following will briefly introduce the drawings that need to be used in the description of the embodiments. Obviously, the drawings in the following description are some embodiments of the present invention, and other drawings may be obtained from these drawings without creative work for a person of ordinary skill in the art.

DETAILED DESCRIPTION OF THE PREFERRED EMBODIMENTS

Figure 1:
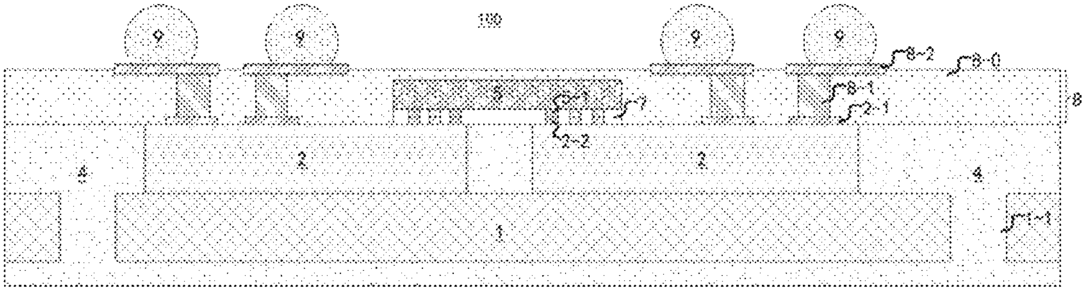
FIG. 1 schematically illustrates a vertical cross-sectional view of a chiplet-fine-interconnection-package structure according to one embodiment of the present invention.

In order to make the purpose, technical solutions, and advantages of the embodiments of the present invention clearer, the technical solutions in the embodiments of the present invention will be described clearly and completely below in conjunction with the figures in the embodiments of the present invention. Apparently, the described embodiments are some but not all of the embodiments of the present invention. Based on the embodiments of the present invention, all other embodiments obtained by a person of ordinary skill in the art without making any creative works fall within the scope of protection of the present invention.

It should be noted that the embodiments in the present application and the features in the embodiments can be combined with each other without conflict.

It should also be noted that the terms used in the present application are generally terms commonly used by a person of ordinary skill in the art, and if they are inconsistent with commonly used terms, the terms used in the present application shall prevail.

Finally, it should also be noted that relational terms herein such as "first" and "second" are used only to distinguish one entity or operation from another, without necessarily requiring or implying any such actual relationship or sequence between such entities or operations, and it should be understood that such terms as used are interchangeable as appropriate, and are only a way of distinguishing between objects with the same attributes in the embodiments of the present application. Moreover, the terms "including" and "comprising" not only include those elements explicitly listed, but also other elements that are inherent in such processes, methods, items, or devices. Without further limitations, an element defined by the phrase "including . . . " does not exclude the presence of additional identical elements in the processes, methods, articles, or devices including said element. For a person of ordinary skill in the art, the specific meanings of the above terms in the present invention can be understood according to the specific circumstances.

The term "chiplet" herein, also known as small chip, refers to a system-on-chip set formed by integrating and packaging chips or dies that meet specific functions through advanced packaging technology.

The term "chip" herein refers both to any type of semiconductor chip or integrated circuit chip that implements a specific function, and to any type of semiconductor die or integrated circuit die that implements a specific function.

The term "fine line" herein refers to an internal interconnect where both the line width of a single line and the line spacing between two adjacent lines are less than 10 um.

The term "first side surface" herein is used to describe only the surface of the substrate on which the chip is attached, the term "second side surface" herein is used to describe only the surface of the substrate opposite to the first side surface, the term "first surface" herein is used to describe only the surface of the chip on which a pin-array is arranged, and the term "first silicon bridge surface" herein is used to describe only the surface of the silicon bridge structure that is opposite to the surface on which the pin-array is arranged. Therefore, it can be understood that when the surface on which the substrate is attached to the chip, the surface on which the chip is arranged with the pin-array, or the surface on which the silicon bridge structure is arranged with the pin-array changes, the positions referred to by the first side surface, the second side surface, the first surface, and the first silicon bridge surface will also change accordingly, i.e., "first side surface", "second side surface", "first surface", and "first silicon bridge surface" should not be limited to the specific surfaces shown in the drawings.

The assembly of individually designed computing units or functional units through advanced packaging technology can not only ensure the yield of each unit by selecting the most suitable semiconductor process for each unit, but also effectively reduce the design and manufacturing cost of the chip and shorten the research-and-development cycle of the chip, wherein Die-to-Die internal interconnection technology is the key to achieve the integrated packaging of chips or dies that meet specific functions, and is the basis for advanced packaging. Among the various forms of advanced packaging technologies developed, the packaging based on the silicon bridge structure has gained widespread attention due to its relatively low cost and small package size. In the packaging technology based on the silicon bridge structure, the internal interconnection is achieved through the silicon bridge structure, and in order to ensure lower packaging cost and smaller package size, it is advantageous to make the size of the silicon bridge structure as small as possible, but the limited silicon bridge area will inevitably affect the interconnection density between the chips and the integration capability of the chiplet. Therefore, in the packaging technology based on the silicon bridge structure, the effective balance of packaging cost, package size, interconnection density, and the integration capability has become a new technical problem and challenges faced by a person of ordinary skill in the art. Based on this, the embodiments of the present invention aim to provide a packaging technology solution based on the silicon bridge structure to reduce the packaging cost and package size while ensuring high interconnection density and integration capability of the chiplet.

The solution provided by the embodiments of the present invention will be described in detail below first from the perspective of the configuration of the package structure obtained in one of the embodiments.

FIG. 1 schematically illustrates a vertical cross-sectional view of a package structure 100 according to an embodiment of the present invention. As shown in FIG. 1, the package structure 100 provided by the embodiment of the present invention comprises a substrate 1, a chip 2 attached to a first side surface 1A of the substrate 1, a plastic package layer 4 covering the substrate 1 and the chip 2, a silicon bridge structure 5, an underfill 7 located between the silicon bridge structure 5 and the chip 2 and directly below the silicon bridge structure 5, a build-up layer 8 located on the plastic package layer, and a solder bump 9, wherein, the chip 2 includes a first pin-array 2-2 having a first spacing and a second pin-array 2-1 having a second spacing, the first spacing is preferably arranged to be narrower than the second spacing so that the first pin-array 2-2 has a higher density than the second pin-array 2-1. The silicon bridge structure 5 is bonded on the first pin-arrays 2-2 of the two adjacent chips 2 to enable interconnection between the two adjacent chips 2 through the silicon bridge structure 5 and the first pin-arrays 2-2. The build-up layer 8 includes a first insulating material 8-0, a first interconnect 8-1 formed in the first insulating material 8-0 and a third pin-array 8-2 located on a surface of the first insulating material 8-0, the third pin-array 8-2 is electrically connected to the second pin-array 2-1 through the first interconnect 8-1. The solder bumps 9 are arranged on the third pin-arrays 8-2 of the build-up layer 8 to achieve electrical conduction with the second pin-arrays 2-1 of the chips through the third pin-arrays 8-2 of the build-up layer. In the package structure 100 of the embodiments of the present invention, the substrate 1 is used as a carrier of the package structure 100 to provide support and protection for it. Specifically, any existing carrier or carrier-like structure can be used as the substrate, and the inside of the substrate can be designed to include interconnects or not include interconnects depending on the requirements. In some possible embodiments, the substrate may be made of a composite material of organic materials such as BT material, ABF material, MIS material, PI resin material, and PE resin material. In other possible embodiments, the substrate may also be made of ceramic materials such as alumina, aluminum nitride, or silicon carbide. In other embodiments, the substrate can also be made of copper, glass, silicon and other suitable materials. Since the substrate of the embodiments of the present invention is a permanent substrate for the package structure (i.e., it does not need to be removed during the packaging process), it can provide support and protection for the package structure, and when the substrate is made of a thermal conductivity material such as copper, it can also provide enhanced heat dissipation for the chip attached thereto, so that the package structure has a better heat dissipation effect. In particular, the substrate 1 of the embodiments of the present invention is provided with a microvia 1-1, and the microvia 1-1 is a tiny through-hole opened on the substrate, forming a fluid-connected space between and the first side surface 1A and the second side surface 1B of the substrate 1, so that the plastic package layer 4 of the package structure 100 of the embodiments of the present invention can be prepared on the second side surface 1B of the substrate 1 to further achieve the effect of simplifying the packaging process steps, reducing the cost of manufacturing the package structure 100 and ensuring the reliability of the package structure. As shown in FIG. 1, in the package structure 100 manufactured in the embodiments of the present invention, the microvias 1-1 on the substrate 1 are filled with the plastic package materials of the plastic package layer, which ensures that the supporting function played by the substrate 1 will not be affected by the opened microvias. In a specific implementation, the opening position, size, shape and spacing of the microvias 1-1 on the substrate 1 are not specifically limited in the embodiments of the present invention as long as it is satisfied that the plastic package materials of the plastic package layer can be injected into an area between the first side surface 1A of the substrate and a temporary bonding layer through the microvias, so that the plastic package layer can be prepared on the second side surface 1B of the substrate 1 to obtain the plastic package layer that does not cover the first surface of the chip or does not cover the first silicon bridge surface of the silicon bridge structure.

The chip in the package structure 100 is used to provide the required chip function for the package structure, which can be any chip or die, etc. that realizes a desired specific function, and the chip function and the number thereof provided by it can be arranged based on requirements, so that the package structure 100 can provide the desired chip function and performance based on the function and number of the attached chips 2. Exemplarily, the chips in the package structure 100 may be processor chips, memory chips, sensor chips, passive component chips, etc. In a specific application, multiple chips with the same function can be attached to the substrate, or multiple chips with different functions can also be attached to the substrate. The attached chips can be one or more chips with computing functions, or it can be one or more chips with data transmission functions, so as to obtain the chiplet package structure with required functions. Preferably, the number of the chips 2 can be arranged to more than two. In order to achieve the high integration and high-density interconnection of the chip in the package structure 100, in a preferred embodiment, the first spacing of the first pin-array of the chip can be arranged to be less than 10 um such that the high-density pins and low-density pins can be set up separately in the design of the chip, and the fine interconnection between the chips can be achieved by means of a high-density first pin-array through the silicon bridge structure, thereby increasing the interconnection density and data transmission speed between chips integrated in the package structure 100. In addition, by setting up the high-density pins and low-density pins separately, and only using the silicon bridge structure to achieve the fine interconnection of the high-density pins of the chip, the size of the silicon bridge structure used for interconnection can also be effectively reduced, thereby reducing the packaging cost and size of the package structure 100.

The plastic package layer in the package structure 100 covers the substrate and the chip to fix and protect the chip attached to the first side surface of the substrate 1. As one of the possible embodiments, as shown in FIG. 1, the plastic package layer 4 covers the first side surface and the second side surface of the substrate, and a side surface of the chip where the first pin-array and the second pin-array are not provided (i.e., the surface of the chip provided with the first pin-array and the second pin-array, hereinafter referred to as the first surface, is not wrapped and covered by the plastic package layer 4), and fills the microvias of the substrate to fix and protect the chip as well as to expose the pin-array of the chip to facilitate the electrical connection between the chip and other structures or components through the pin-array. It should be noted that the plastic package layer can be prepared by using commonly used plastic package materials in the present field, and its specific materials is not specifically limited in the embodiments of the present invention.

Figure 12:
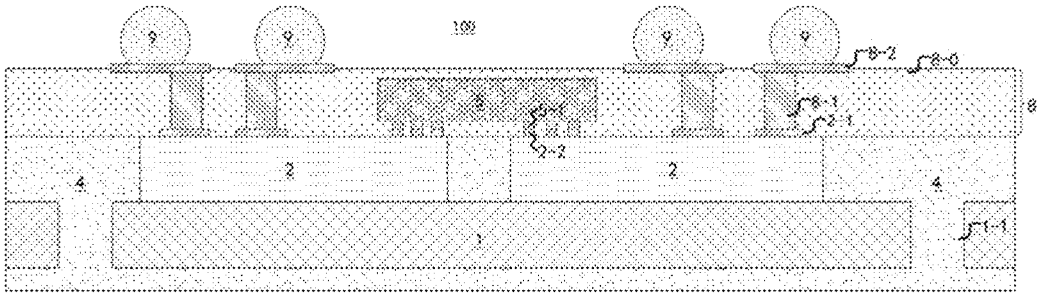
FIG. 12 schematically illustrates a vertical cross-sectional view of a package structure according to another embodiment of the present invention.

The silicon bridge structure in the package structure 100 is used to provide high-density interconnection between the chips, so that a high-density interconnection between the chips with different specific functions becomes possible. Specifically, the silicon bridge structure is arranged between two adjacent chips, and is bonded to the first pin-arrays of the two adjacent chips. In the case of multiple chips, in order to achieve the interconnection between corresponding chips, it is necessary to provide a silicon bridge structure between the corresponding two adjacent chips. Therefore, in the package structure 100, depending on the number of chips and the need of the interconnection between the chips, the number of the silicon bridge structures provided may be one, or two or more, and the number of the silicon bridge structures and which adjacent chips they are specifically arranged between are not particularly limited in the embodiments of the present invention. As a possible embodiment, in order to provide high-density fine interconnection between the chips, the silicon bridge structure is implemented as a fine line including a fourth pin-array 5-1 capable of bonding to the first pin-array of the chip and electrically conducting with the fourth pin-array (not shown in the figure). In some preferred embodiments, the silicon bridge structure 5 is a thinned silicon bridge having a thickness between 1 and 200 μm to further reduce the size of the package structure. In other embodiments, the silicon bridge structure 5 may also be made from an unthinned silicon bridge structure, wherein the unthinned silicon bridge structure may preferably be made from a thinner silicon wafer, such as a thinner silicon wafer having a thickness of 200 μm, wherein FIG. 1 illustrates a package structure using a thinned silicon bridge, and FIG. 12 illustrates a package structure using an unthinned silicon bridge. As shown in FIG. 1 and FIG. 12, the thickness of the package structure with the thinned silicon bridge can be significantly reduced.

The underfill in the package structure 100 is used to provide a reinforcement and support structure between the chip and the silicon bridge structure to improve the interconnection stability of the chip and the silicon bridge structure, thereby ensuring the performance and the stability of the package structure. As a possible embodiment, the underfill can be made of the same material as the plastic package layer. In other embodiments, the underfill can also be made of a material different from the plastic package layer, such as an insulating material with better fluidity than the plastic package layer material or other suitable materials. When the underfill is prepared with a material different from the plastic package layer, especially when it is prepared with an insulating material with better fluidity than the plastic package layer material, the chip of the package structure and the silicon bridge structure are reinforced and sealed by the underfill, while the other areas of the chip and the substrate are reinforced and sealed by the plastic package layer, thus enabling not only better performance of the package structure, but also lower cost of the plastic package of the package structure. When the underfill is made of the same material as the plastic package layer, in order to make the entire package structure have better stability, materials with better fluidity can be used to prepare the plastic package layer and the underfill. In a more preferred embodiment, different processes can be used to prepare the package structure depending on whether the material used for the plastic package layer and the underfill are the same. For example, when the plastic package layer and the underfill are made of different materials, the package structure can be prepared by preparing the plastic package layer and the underfill separately; when the plastic package layer and the underfill are made of the same material, the same process step can be used to prepare the integrated plastic package layer and the underfill at the same time to simplify the packaging process. In this case, in practical applications, it is thus possible to select the preparation material and process for the plastic package layer and the underfill according to the requirements of the performance of the chip on the application side, so that the package structure can be prepared to meet the requirements of the corresponding scenarios.

Figure 25:
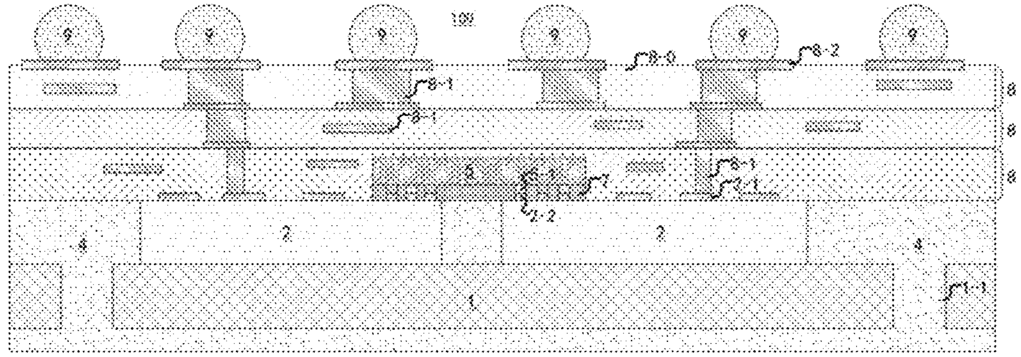
FIG. 25 schematically illustrates a vertical cross-sectional view of a chiplet-fine-interconnection-package structure according to yet another embodiment of the present invention.

The build-up layer in the package layer 100 covers the plastic package layer and the silicon bridge structure, which covers the silicon bridge structure to provide protection for the silicon bridge structure. In addition, in the embodiments of the present invention, an electrical conduction structure interconnected with the second pin-array of the chip is also arranged in the build-up layer, so that the chip can achieve the interconnection with the external device through the electrical conduction structure in the build-up layer. As a possible embodiment, the electrical conduction structure of the build-up layer 8 includes a first interconnect 8-1 formed in the first insulating material 8-0 and a third pin-array 8-2 located on the surface of the first insulating material 8-0. Thus, the chip can provide an external electrical conduction contact point through the third pin-array 8-2 to achieve electrical interconnection with the external device, thereby providing the corresponding chip function for the external device, wherein the density, interconnection method, number, etc. of the first interconnect can be provided according to demand, and the position and number of the third pin-array can also be provided according to demand, so that the performance of the package structure such as data transmission and data processing can meet the application requirements. As a preferred embodiment, the first interconnect can be implemented as a vertical interconnection structure vertically connected with the second pin-array and the third pin-array, thereby reducing the transmission distance and increasing the data processing speed of the package structure. In other possible embodiments, the first interconnect can also be implemented as a combination of a vertical interconnection structure and other interconnection structures. In some possible embodiments, the build-up layer 8 is configured to include only one layer, and in the embodiment where the build-up layer only includes one layer, as shown in FIG. 1 and FIG. 12, the electrical conduction structure of the build-up layer 8 includes the first interconnect 8-1 formed in the first insulating material 8-0 and the third pin-array 8-2 located on the surface of the first insulating material 8-0. In other possible embodiments, the build-up layer 8 may also be configured to include two or more layers. In an embodiment including more than two build-up layers, the innermost layer of the build-up layer 8 is electrically connected to the second pin-array of the chip through the first interconnect, the middle layer of the build-up layer 8 is electrically connected to the first interconnect of the build-up layer of the adjacent layer through the first interconnect in the layer, and the third pin-array is arranged on the outermost layer of the build-up layer and exposed to the outer surface of the outermost build-up layer to conveniently provide external electrical conduction contact points. Taking the build-up layer including three layers as an example, as shown in FIG. 25, the electrical conduction structure of the innermost layer and the middle layer of the build-up layer 8 includes the first interconnect 8-1 formed in the first insulating material 8-0, the electrical conduction structure of the outermost layer of the build-up layer 8 includes the first interconnect 8-1 formed in the first insulating material 8-0 and the third pin-array 8-2 located at the surface of the first insulating material 8-0, and the third pin array 8-2 is electrically connected to the second pin-array of the chip through the first interconnect 8-1 in each layer of the build-up layer. Thus, by adjusting the number of the build-up layers, the density of the first interconnect, the interconnection method, the number, etc., the fineness of the interconnects and the density of the interconnects of the package structure can be improved accordingly, so that the performance of the prepared package structure can meet the requirements of corresponding application scenarios. It should be noted that the innermost layer of the build-up layer here refers to the layer adjacent to the plastic package layer, and the outermost layer refers to the uppermost layer along the direction away from the plastic package layer. As a possible embodiment, the first insulating material of the build-up layer can be the same material as that of the plastic package layer. Of course, in some other embodiments, the first insulating material of the build-up layer can also be made of a material different from the plastic package layer. Exemplarily, the first insulating material of the build-up layer can be a photosensitive material such as photoresist and dry film, or the first insulating material of the build-up layer can also be a non-photosensitive material such as DAF film and resin, and the first interconnect of the build-up layer and the third pin-array can be made of suitable materials such as metal. Thus, in specific applications, according to the expectations of the fineness and structure of the fine lines and the performance of the package structure, the same or different materials as the plastic package layer can be selected to prepare the build-up layer. When the build-up layer is made of a material different from the plastic package material, such as a photosensitive material, a package structure with higher fineness and yield can be prepared. Compared with the package structure that uses the plastic package layer as the plastic package protection layer of the silicon bridge structure and arranges the externally connected electrical conduction structure on the plastic package layer, the embodiments of the present invention provide protection for the silicon bridge structure and arrange the externally connected electrical conduction structure of the chip by preparing the build-up layer so that the material of the build-up layer can be flexibly selected according to different application requirements to achieve the effect of flexibly balancing the packaging cost and the performance of the chip.

The solder bumps in the package structure 100 are used to be provided as an interface for the external connection of the entire package structure, which may be specifically arranged on the third pin-array or at least partially in electrical contact with the third pin-array, so that the solder bumps can be electrically connected to the second pin-array of the chip through the third pin-array and the first interconnect of the build-up layer. Thus, by electrically interconnecting the external device with the solder bumps, it is possible to achieve the interconnection between the external device and all the chips provided in the package structure to provide the corresponding chip function for the external device.

Figure 2:
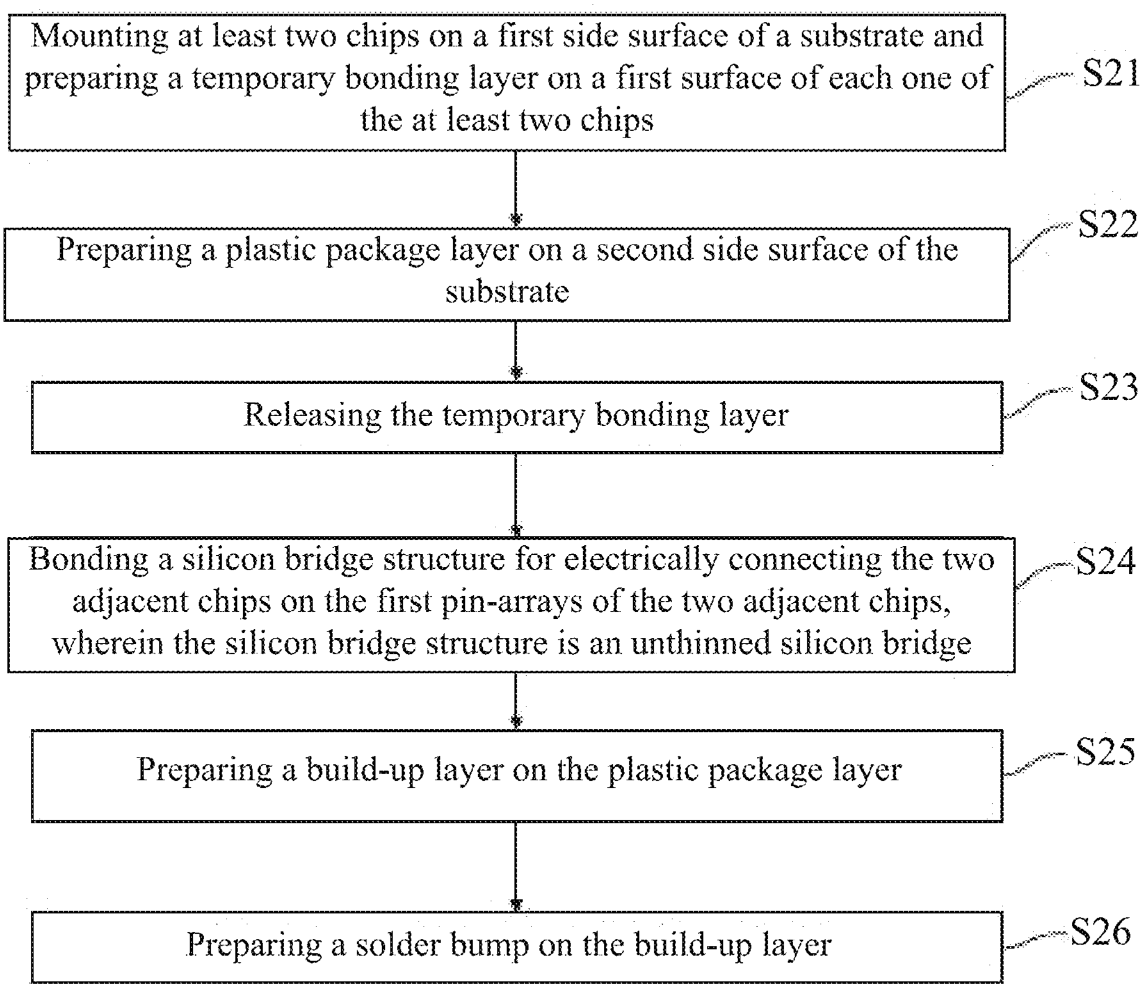
FIG. 2 schematically illustrates a flow chart of a method of manufacturing a chiplet-fine-interconnection-package structure according to one embodiment of the present invention.
Figure 5:
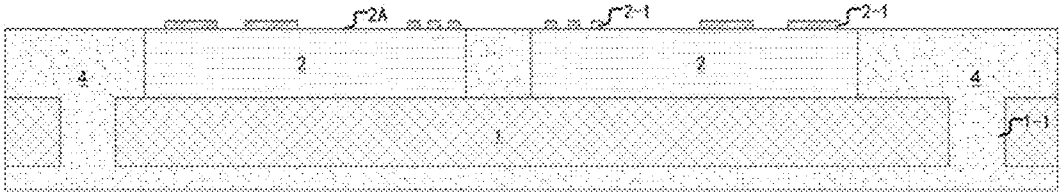
FIG. 5 schematically illustrates a vertical cross-sectional view of a package substrate structure obtained after releasing a temporary bonding layer according to one embodiment of the present invention.
Figure 6:
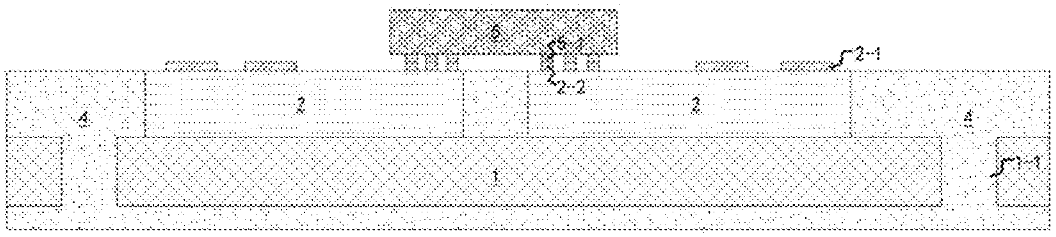
FIG. 6 schematically illustrates a vertical cross-sectional view of a package structure obtained after bonding a silicon bridge structure according to one embodiment of the present invention.
Figure 7:
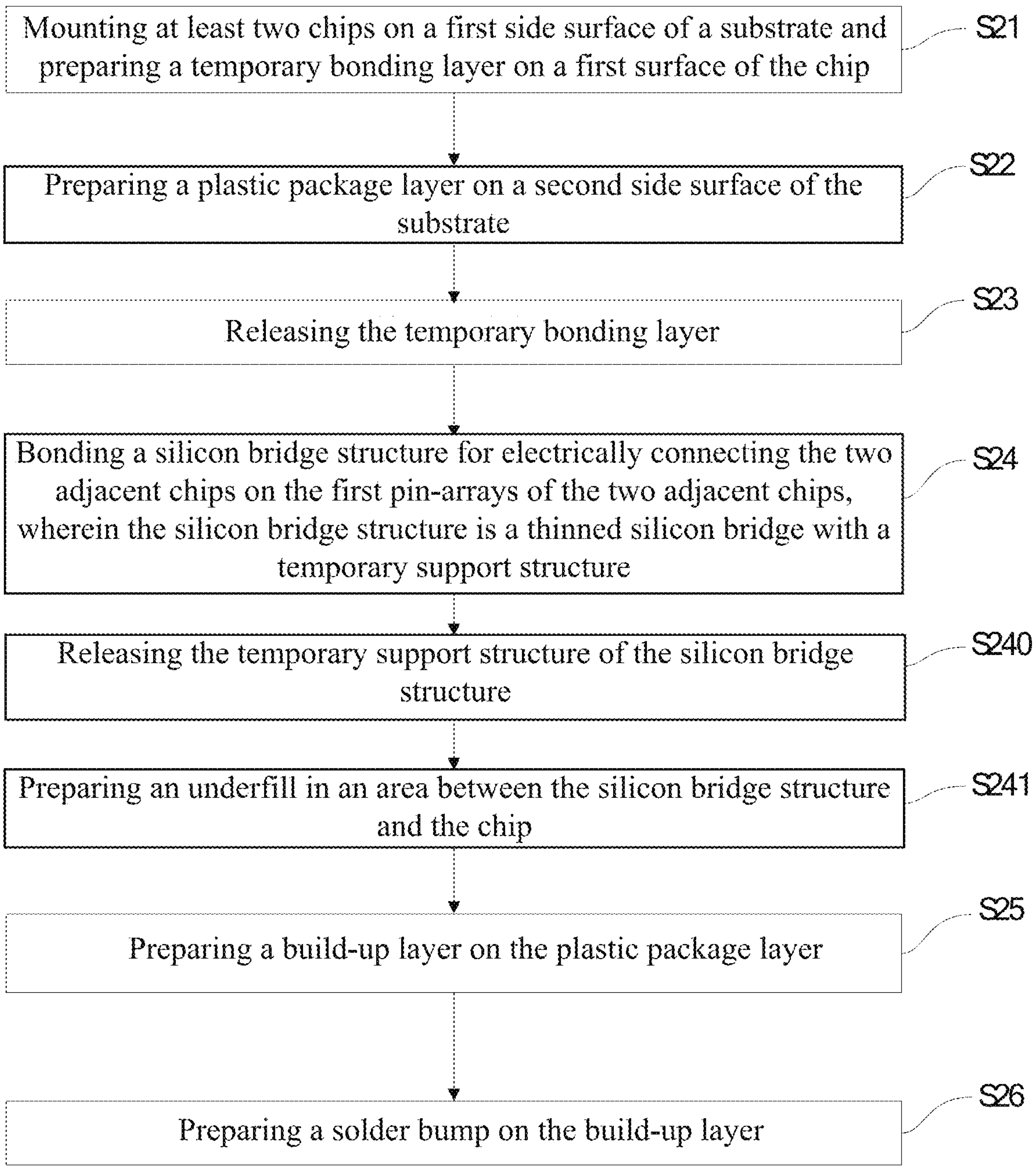
FIG. 7 schematically illustrates a flow chart of a method of manufacturing a chiplet-fine-interconnection-package structure according to another embodiment of the present invention.

The manufacturing method of the package structure with the above structure will be described in detail below with reference to FIG. 2 to FIG. 14. FIG. 2 schematically illustrates the flow of the method for manufacturing the chiplet-fine-interconnection-package structure in some embodiments; FIG. 7 schematically illustrates the flow of the method for manufacturing the chiplet-fine-interconnection-package structure in some other embodiments; FIG. 3 to FIG. 6 and FIG. 8 to FIG. 14 schematically illustrate the process of manufacturing the package structure with the above features by using the method shown in FIG. 2 or FIG. 7.

Figure 3:
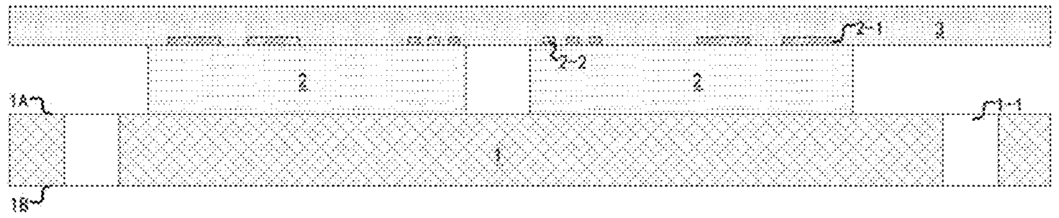
FIG. 3 schematically illustrates a vertical cross-sectional view of a package structure obtained after preparation of a temporary bonding layer on a chip according to one embodiment of the present invention.
Figure 4:
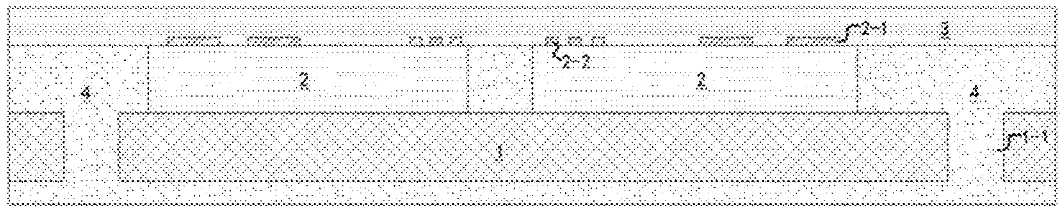
FIG. 4 schematically illustrates a vertical cross-sectional view of a package structure obtained after preparation of a plastic package layer according to one embodiment of the present invention.

As shown in FIG. 2, in some embodiments, the method for manufacturing the chiplet-fine-interconnection-package structure comprises an operation S21 of mounting at least two chips on a first side surface of a substrate and preparing a temporary bonding layer on a first surface of the chips. In some exemplary embodiments, the substrate may be a carrier or carrier-like plate made of a composite material of organic materials such as BT material, ABF material, MIS material, PI resin material, and PE resin material, or a carrier or carrier-like plate made of ceramic materials such as alumina, aluminum nitride, or silicon carbide, or a carrier or carrier-like plate made of copper, glass, silicon, or other suitable materials, wherein microvias are prepared on the substrate by means of mechanical perforation, plasma etching perforation or laser perforation. Preferably, copper can be selected as the material for preparing the substrate, and the microvias are prepared on the copper substrate by means of mechanical perforation, thereby producing the substrate with the microvias. Since copper has good thermal conductivity, mounting the chip by preparing the copper substrate with the microvias can not only provide support and protection for the chip, but also help to enhance the heat dissipation capability of the chip, thereby improving the heat dissipation performance of the package structure. In some exemplary embodiments, a temporary bonding layer can be prepared by: attaching the temporary bonding material to the temporary carrier first to form a temporary bonding structure, and then bonding the temporary bonding material of the temporary bonding structure onto the chip by means of thermal compression. For example, the temporary bonding material may be a pyrolytic bonding film, photolytic bonding film, etc. FIG. 3 correspondingly illustrates a vertical cross-sectional view of the package structure obtained after the temporary bonding layer 3 is prepared on the first surface 2A of at least two chips mounted on the first side surface 1A of the substrate 1 in some embodiments, as shown in FIG. 3, the temporary bonding layer 3 is arranged on the first surface 2A of the chip, and the temporary bonding layer 3 is bonded on the first pin-array and the second pin-array of the chip, and the temporary bonding layer 3 has the same length as the substrate, thus facilitating the preparation of a desired plastic package layer between the substrate and the temporary bonding layer, and leaving the first pin-array and the second pin-array of the chip exposed, that is, not be wrapped by the plastic package layer, thus making it possible to directly prepare a silicon bridge structure on the chip, so that the temporary bonding layer can be used to protect the pin-array and wiring pattern on the front side surface of the chip (i.e., the chip surface arranged with the pin-array, which is referred to as the first surface in the embodiment of the present invention), and it can also avoid the cumbersomeness of exposing the pin-array on the front side surface of the chip through the grinding process to prepare the silicon bridge structure in the subsequent process, which helps to simplify the packaging process, reduce packaging costs, and avoid damage to the layout and pins on the front side surface of the chip. As shown in FIG. 2, in some embodiments, the method of manufacturing the chiplet-fine-interconnection-package structure further comprises an operation S22 of preparing a plastic package layer on a second side surface of the substrate. The existing processes and materials for preparing the plastic package layer can be used to prepare the plastic package layer. In the embodiments of the present invention, since the microvias are prepared on the substrate, when the plastic package layer is prepared on the second side surface of the substrate, the plastic package materials of the plastic package layer can flow from the microvias into an area between the first side surface of the substrate and the temporary bonding layer to prepare the plastic package layer formed that covers the first side surface and the second side surface of the substrate, and the plastic package layer formed on the side surfaces other than the first surface of the chip, and at the same time, since the first pin-array and the second pin array of the chip are covered by the temporary bonding layer, the formed plastic package layer will not cover the first pin-array, the second pin-array and the wiring pattern on the front side surface of the chip, the plastic package layer thus obtained can protect the first side surface and the second side surface of the substrate at the same time, so that the substrate can be used as a permanent substrate and does not need to be removed. Moreover, since the front side surface of the chip is exposed, a chip interconnection structure such as a silicon bridge structure can be prepared directly on the pin-array on the front side surface of the chip without the need of grinding and other means to expose the pin-array, which simplifies the packaging process. In addition, damage to pins and patterns on the front side surface of the chip can be avoided, thereby reducing packaging costs. FIG. 4 correspondingly illustrates a vertical cross-sectional view of the package structure obtained after preparation of the plastic package layer in some embodiments, as shown in FIG. 4, the plastic package layer 4 covers the first side surface 1A, the second side surface 1B of the substrate 1, and the side surface of the chip 2 that is not arranged with the first pin-array 2-2 and the second pin-array 2-1, but does not cover the first surface 2A of the chip 2, and the plastic package layer also fills the microvias 1-1 of the substrate 1, so that the substrate can provide a stable support for the package structure.

As shown in FIG. 2, in some embodiments, the method of manufacturing the chiplet-fine-interconnection-package structure further comprises an operation S23 of releasing the temporary bonding layer. In the operation S23, a corresponding debonding method may be used to debond the temporary bonding layer according to the selected temporary bonding material. FIG. 5 correspondingly illustrates a vertical cross-sectional view of the package substrate structure obtained after releasing the temporary bonding layer. As shown in FIG. 5, the package structure at this time comprises a substrate 1, two chips 2 attached to the substrate 1 and a plastic package layer 4 covering the substrate 1 and the chips 2, wherein the first pin-array 2-2 and the second pin-array 2-1 of the chips are exposed outside without being covered by the plastic package layer 4.

Figure 8:
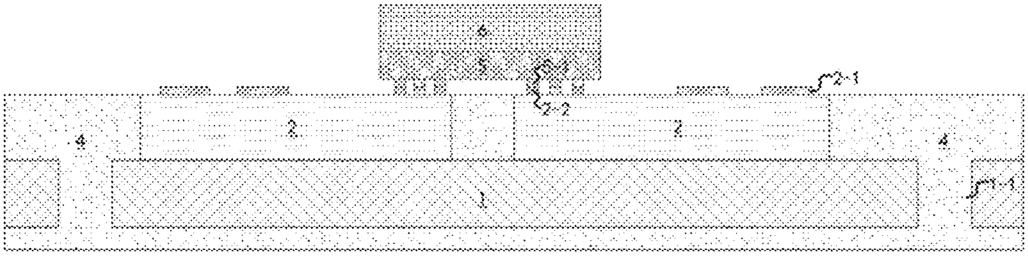
FIG. 8 schematically illustrates a vertical cross-sectional view of a package structure obtained after preparing a thinned silicon bridge with a temporary support structure according to one embodiment of the present invention.
Figure 9:
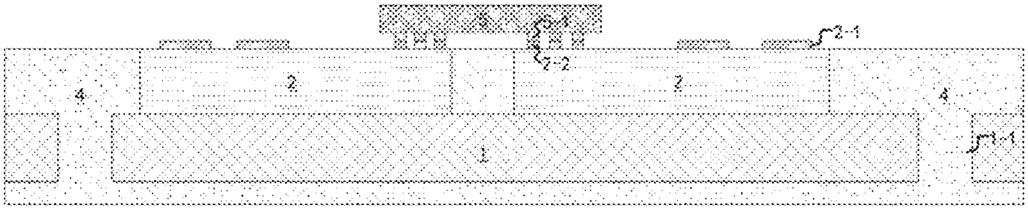
FIG. 9 schematically illustrates a vertical cross-sectional view of a package structure obtained after removing a temporary support structure according to one embodiment of the present invention.

As shown in FIG. 2, in some embodiments, the method of manufacturing the chiplet-fine-interconnection-package structure further comprises an operation S24 of bonding a silicon bridge structure for electrically connecting the two adjacent chips on the first pin-arrays of the two adjacent chips. In some possible embodiments, the silicon bridge structure includes a fourth pin-array that can be bonded to the corresponding first pin-array and fine lines that are electrically connected to the fourth pin-array, and thus the fourth pin-array of the silicon bridge structure can be bonded to the first pin-arrays of the two adjacent chips by means of thermal compression bonding to achieve the interconnection between the two chips bonded by the silicon bridge structure. The silicon bridge structure used in the operation S24 may be a thinned silicon bridge or an unthinned silicon bridge. Taking the unthinned silicon bridge as an example, since the first pin-array and the second pin-array of the chip of the embodiments of the present invention are not protected by the plastic package layer under the protection of the temporary bonding layer, when the unthinned silicon bridge is used, the prepared fourth pin-array of the unthinned silicon bridge can be directly bonded to the first pin-array of the corresponding chip in the operation S24 without first performing a grinding and thinning treatment on the plastic package layer. Furthermore, since the unthinned silicon bridge itself has a higher thickness, its own thickness can provide sufficient mechanical support for it, and therefore, it is only necessary to prepare the fourth pin-array and the fine lines electrically interconnected with the fourth pin-array on the selected silicon wafer with suitable thickness to obtain the prepared unthinned silicon bridge, wherein the suitable thickness here can be set according to demand, preferably not less than 200 μm. Exemplarily, the thickness is preferably 200 μm, since a silicon wafer of 200 μm is relatively thin in size, yet has certain mechanical strength and low cost, it is a better choice to use a silicon wafer of this thickness to prepare the unthinned silicon bridge to ensure the mechanical strength of the silicon bridge structure and to reduce the cost and size of the package structure. Taking the silicon bridge structure 5 as an example of the unthinned silicon bridge, FIG. 6 correspondingly illustrates a vertical cross-sectional view of the package structure obtained after bonding the silicon bridge structure in some embodiments. As shown in FIG. 6, the fourth pin-array 5-1 of the unthinned silicon bridge 5 is directly bonded on the first pin-array 2-2 of the corresponding chip, and the unthinned silicon bridge 5 has a relatively thick thickness. When the silicon bridge structure 5 used in the operation S24 is a thinned silicon bridge, similarly, since the first pin-array and the second pin-array of the chip of the embodiments of the present invention are not protected by the plastic package layer under the protection of the temporary bonding layer, when a thinned silicon bridge is used, the fourth pin-array of the thinned silicon bridge can be directly bonded to the first pin-array of the corresponding chip, and thus, in practice, the thinned silicon bridge can be directly prepared separately, that is, only a small area of the silicon bridge structure for thinning, rather than the entire plastic package layer and the silicon bridge structure at the same time for grinding thinning, thereby simplifying the packaging process and reduce the cost of thinning. When the thinned silicon bridge is prepared separately, the thinned silicon bridge structure itself is relatively too thin to provide sufficient mechanical strength to support for it, in order to ensure a better packaging effect, an additional mechanical support structure can be provided on the thinned silicon bridge. As a possible embodiment, the mechanical support structure provided on the thinned silicon bridge can be a temporary support structure prepared from a material with a certain mechanical strength, and the mechanical strength of the selected material can be set according to requirements. Exemplarily, the material of the temporary support structure may be cured resin material, silicon, silicon dioxide, copper, glass, etc. In the embodiments where the silicon bridge structure uses a thinned silicon bridge with the temporary support structure, after the operation S24, it is also necessary to remove the temporary support structure on the thinned silicon bridge, and FIG. 7 illustrates this possible embodiment. As shown in FIG. 7, unlike the manufacturing method shown in FIG. 2, in the embodiment shown in FIG. 7, after the operation S24, an operation S240 is also comprised to release the temporary bonding structure on the silicon bridge structure, wherein the specific method of embodiment of releasing the temporary support structure may be thermal peeling, laser peeling, etc. Taking the silicon bridge structure 5 as an example of the thinned silicon bridge, FIG. 8 and FIG. 9 correspondingly illustrate the vertical cross-sectional view of the package structure obtained after preparing the silicon bridge in some other embodiments. As shown in FIG. 8, the fourth pin-array 5-1 of the thinned silicon bridge 5 with the temporary support structure 6 is directly bonded to the first pin-array 2-2 of the corresponding chip 2, and the thinned silicon bridge 5 with the temporary support structure 6. As shown in FIG. 9, the temporary support structure 6 has been removed, and the fourth pin-array 5-1 of the thinned silicon bridge 5 is directly bonded to the first pin-array 2-2 of the corresponding chip 2, and the thinned silicon bridge 5 has a thinner thickness, wherein, in some embodiments, the thickness of the thinned silicon bridge can be specifically set to be between 20 to 50 μm to reduce the size of the package structure while ensuring the stability of the package structure.

Figure 10:
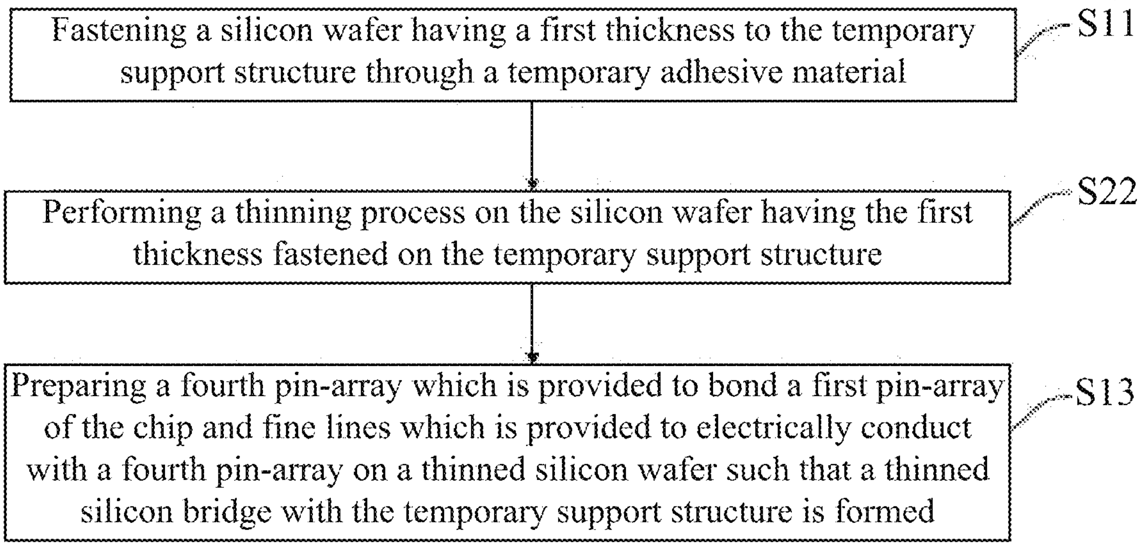
FIG. 10 schematically illustrates a flow chart of a method of manufacturing a thinned silicon bridge with a temporary support structure according to one embodiment of the present invention.

FIG. 10 schematically illustrates a method of manufacturing the thinned silicon bridge with the temporary support structure used in the embodiments shown in FIG. 7 to FIG. 9. As shown in FIG. 10, the manufacturing method thereof comprises an operation S11 of fastening a silicon wafer having a first thickness to the temporary support structure through a temporary adhesive material, wherein the first thickness may be any suitable thickness, for example, 200 μm, so as to facilitate rapid thinning. As a possible embodiment, the temporary adhesive material may be selected from suitable adhesive materials such as thermal peeling adhesive material or laser peeling adhesive material, the temporary support structure may be prepared from materials with certain mechanical strength such as cured resin material, silicon, silicon dioxide, copper, glass, etc. In some embodiments, the method of manufacturing the thinned silicon bridge with the temporary support structure further comprises an operation S12 of performing a thinning process on the silicon wafer having the first thickness fastened on the temporary support structure. In some possible embodiments, the thinning process of the silicon wafer in the operation S12 can be achieved using the CMP treatment. In some other embodiments, the thinning process of the silicon wafer may also be achieved by acid or alkaline etching of the silicon wafer followed by the CMP treatment of the silicon wafer surface, wherein the degree of acid etching or alkaline etching of the silicon wafer can be determined based on the size of the first thickness of the silicon wafer and the desired target thickness, preferably slightly greater than the desired target thickness, for example, about 1 to 10 μm greater than the target thickness. By first acid etching or alkaline etching of silicon, a large amount of silicon can be etched off quickly and inexpensively to achieve rough etching of silicon, and then fine thinning by the CMP process, which can effectively reduce the cost of thinning process. As shown in FIG. 10, in some embodiments, the method of manufacturing the thinned silicon bridge with the temporary support structure further comprises an operation S13 of preparing the fourth pin-array which is arranged to bond the first pin-array of the chip and fine lines which is arranged to electrically conduct with the fourth pin-array on the thinned silicon wafer such that the thinned silicon bridge with the temporary support structure is formed. The specific method of preparing the pin-arrays and the fine lines on the silicon wafer can be implemented by referring to related known technologies, and therefore will not be described in detail here. It should be noted that, according to the method of manufacturing the thinned silicon bridge, when the temporary support structure is fastened on the silicon wafer through the temporary adhesive material, in the operation S240, the temporary adhesive material can be peeled off to release the temporary support structure on the thinned silicon bridge.

Figure 11:
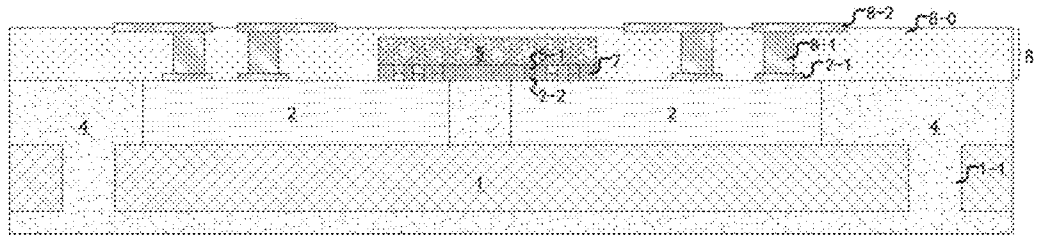
FIG. 11 schematically illustrates a vertical cross-sectional view of a package structure obtained after preparing a build-up layer according to an embodiment of the present invention.
Figure 26:
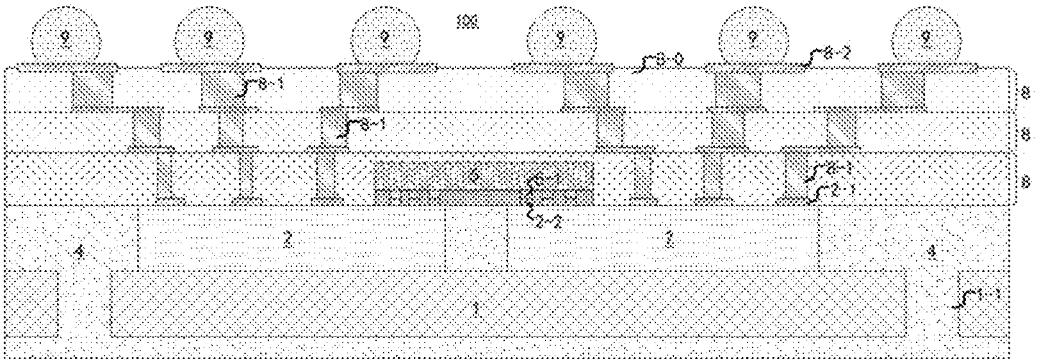
FIG. 26 schematically illustrates a vertical cross-sectional view of a chiplet-fine-interconnection-package structure according to a further embodiment of the present invention.

As shown in FIG. 2, in some embodiments, the method of manufacturing the chiplet-fine-interconnection-package structure further comprises an operation S25 of preparing a build-up layer on the plastic package layer, wherein the prepared build-up layer may be a single layer or multiple layers, and wherein the multiple layers in the embodiments of the present invention refer to two or more layers. When there is only a single build-up layer, the build-up layer includes a first insulating material, a first interconnect formed in the first insulating material and a third pin-array arranged on a surface of the first insulating material, the third pin-array is electrically connected to the second pin-array through the first interconnect. When there are two or more layers included in the build-up layer, each build-up layer of the innermost and middle layers includes a first insulating material and a first interconnect formed in the first insulating material, the outermost layer of the build-up layer includes a first insulating material, a first interconnect formed in the first insulating material and a third pin-array arranged on a surface of the first insulating material, and the third pin-array is electrically connected to the second pin-array through the first interconnects in each layer of the build-up layer. In some embodiments, the first insulating material can be selected from photosensitive materials such as photoresist, dry film, etc. In some other embodiments, the first insulating material can also be selected from non-photosensitive materials such as DAF film, resin, etc. In other possible embodiments, the first insulating material can also be the same plastic package material as that of the plastic package layer. Taking the photosensitive material as an example for the first insulating material, in the operation S25, the first insulating material can be prepared by using photosensitive material on the plastic package layer, and then exposure and development can be performed on an appropriate position on the first insulating material to expose the second pin-array of the chip at the corresponding position, and then the first interconnect is prepared on the exposed second pin-array to obtain the first interconnect electrically connected to the second pin-array; and finally, at least part of the first interconnect is prepared with a third pin-array electrically connected thereto, wherein the appropriate position here may be at least a partial area of those second pin-arrays which are expected to be electrically connected therewith, or may be the entire area of those second pin-arrays which are expected to be electrically connected therewith. Taking the non-photosensitive material as an example for the first insulating material, in the operation S25, the first insulating material can be prepared on the plastic package layer by using non-photosensitive material, and then perforation can be performed at appropriate positions on the first insulating material to expose the second pin-array of the chip at the perforation position, and then the first interconnect can be prepared on the exposed second pin-array to obtain the first interconnect electrically connected to the second pin-array; finally, the third pin-array electrically connected to at least part of the first interconnect is prepared on the first interconnect. Exemplarily, the perforation method may be laser perforation, ICP etching perforation, mechanical perforation, etc. In some possible embodiments, the prepared first interconnect may be a vertical interconnection structure, and in some other embodiments, the prepared interconnect may also be a combination of the vertical interconnection structure and other interconnection structures. The first interconnect is preferably made of suitable materials such as metal, wherein as a possible embodiment, in the operation S25, the first interconnect may be manufactured by sputtering metals such as titanium, copper, etc. In some embodiments, in the operation S25, the first interconnect may also be manufactured by electroplating copper, tin and other metals. In other embodiments, in the operation S25, the first interconnect may also be manufactured by filling it with conductive material containing metal or alloy particles such as silver, tin, solder, etc. FIG. 11 schematically illustrates a vertical cross-sectional view of the package structure obtained after preparing the build-up layer in the embodiments, taking as an example that the silicon bridge adopted is the thinned silicon bridge and the underfill is prepared through the same process as the operation S241 shown in FIG. 7 before the preparation of the build-up layer, as shown in FIG. 11, the build-up layer 8 covers the plastic package layer 4, the chip 2 and the thinned silicon bridge 5, and wraps the thinned silicon bridge 5, and the first interconnect 8-1 in the build-up layer 8 is a vertical interconnection structure, which is prepared in a partial area of the second pin-array 2-1 and the third pin-array 8-2, and directly connects the second pin-array 2-1 with the third pin-array 8-2 electrically. As shown in FIG. 11, the communication distance between the second pin-array and the third pin-array can be significantly shortened through the vertical interconnection structure, and the data transmission speed of the chip can be improved. It should be noted that, in the embodiment shown in FIG. 11, the prepared build-up layer is a single layer, and in other embodiments, multiple layers of the build-up layer can be prepared according to requirements to meet the corresponding needs. When preparing multiple layers of the build-up layer, it is only necessary to prepare the third pin-array on the outermost layer of the build-up layer, and for the other layers of the build-up layer, it is only need to prepare the first interconnect in the first insulating material that can electrically connect the third pin-array to the second pin-array. For example, as shown in FIG. 25, in the preparation of a three-layer build-up layer, the innermost layer and the middle layer of the build-up layer 8 include the first insulating material 8-0 and the first interconnect 8-1 formed in the first insulating material 8-0, the first interconnect 8-1 is a combination of the vertical interconnection structure and other types of interconnection structures, and the third pin-array 8-2 is only arranged on the outermost layer of the build-up layer, and it is electrically connected with the second pin-array 2-1 through the first interconnect 8-1 of each layer. Taking the preparation of the three-layer build-up layer as shown in FIG. 26 as an example, the innermost layer and the middle layer of the build-up layer 8 include the first insulating material 8-0 and the first interconnect 8-1 formed in the first insulating material 8-0, the first interconnect 8-1 of each layer is the vertical interconnection structure, and the third pin-array 8-2 is only arranged on the outermost layer of the build-up layer, which is electrically connected to the second pin-array 2-1 through the first interconnect 8-1 of each layer. In addition, in other embodiments, it is possible to prepare the build-up layer without the underfill before the preparation of the build-up layer as shown in FIG. 2, and the embodiments of the present invention should not be regarded as a limitation on the number of layers of the build-up layer and whether the underfill must be arranged. It can be understood that when the thinned silicon bridge is adopted and the process of operation S241 is not performed as shown in FIG. 2 before the preparation of the build-up layer, a package structure similar to FIG. 11 can be obtained, the only difference is that, in the package structure obtained in such manner, according to the characteristics of the first insulating material of the prepared build-up layer (such as its material fluidity), the area below the silicon bridge structure 5 will be at least partially filled with the first insulating material of the build-up layer.

Figure 13:
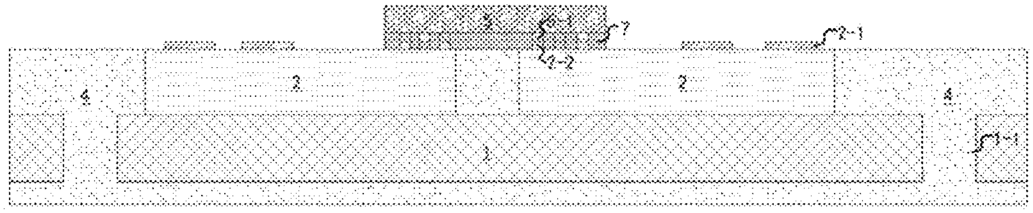
FIG. 13 schematically illustrates a vertical cross-sectional view of a package structure obtained after preparing an underfill according to one embodiment of the present invention.

As shown in FIG. 2, in some embodiments, the method of manufacturing the chiplet-fine-interconnection-package structure further comprises an operation S26 of preparing a solder bump on the build-up layer, wherein the solder bumps are prepared on the third pin-array of the build-up layer to electrically connect to the second pin-array of the chip through the third pin-array. In some embodiments, after the processing of the method flow shown in FIG. 2, the package structure finally obtained is the same as the package structure shown in FIG. 12. As shown in FIG. 12, the silicon bridge structure 5 in the package structure 100 is an unthinned silicon bridge, no underfill is prepared below the silicon bridge structure 5, and the area below the silicon bridge structure 5 is filled with the first insulating material 8-0 of the build-up layer when the build-up layer is prepared. In other embodiments, the number of layers of the build-up layer of the package structure, the interconnection method of the first interconnect, the number of the chips, the thickness and number of the silicon bridge structures, the number of the solder bumps, etc. can also be adapted according to requirements and expectations in order to obtain the package structure of the corresponding configuration and performance. For example, through the method of manufacturing the chiplet-fine-interconnection-package structure shown in FIG. 7, the package structure 100 finally obtained is as shown in FIG. 1, the silicon bridge structure of the package structure 100 is a thinned silicon bridge, and in order to ensure the stability of the bonding between the silicon bridge structure and the chip, in the embodiment of FIG. 7, prior to the preparation of the build-up layer, the operation S241 is also comprised to prepare the underfill in the area below the silicon bridge structure between the silicon bridge structure and the chip, and the package structure obtained by the operation S241 is shown in FIG. 13, wherein the underfill 7 is prepared separately below the silicon bridge structure 5, so that the underfill can be prepared with an appropriate material according to requirements to obtain a package structure suitable for chip performance in different application scenarios. Thus, through the manufacturing method shown in FIG. 7, the package structure shown in FIG. 1 can be prepared and obtained. It should also be noted that in the embodiment shown in FIG. 7, since the underfill 7 is prepared separately, the material used to prepare the underfill in the operation S241 can be the same material as the plastic package material of the plastic package layer, or a material different from the plastic package material of the plastic package layer, which is not limited in the embodiments of the present invention. When a more fluid and expensive material is chosen for the preparation of the underfill 7, since the underfill 7 is only located in the area below the silicon bridge structure, that is, only a material with better fluidity is used between the silicon bridge structure and the chip for fixing and plastic packaging, the packaging cost can be effectively reduced while ensuring the excellent performance of the package structure. Exemplarily, the underfill added at the bottom of the silicon bridge structure can be any one or more capillary underfill (CUF), non-flow underfill (NUF) and wafer-level underfill (WLUF) combination.

Figure 14:
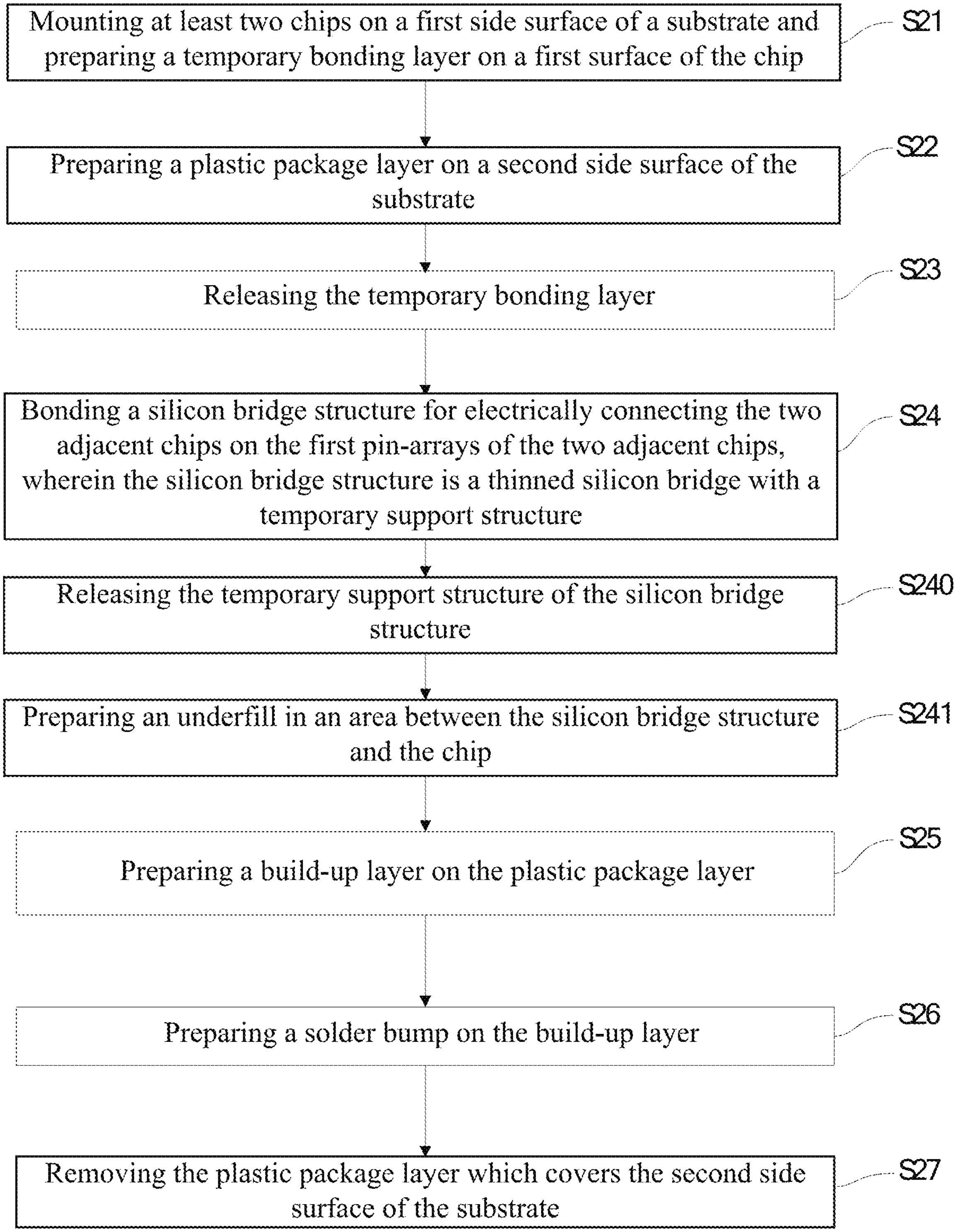
FIG. 14 schematically illustrates a flow chart of a method of manufacturing a chiplet-fine-interconnection-package structure according to yet another embodiment of the present invention.
Figure 15:
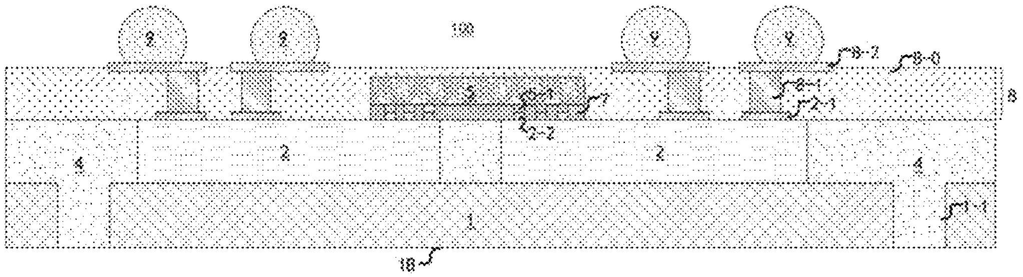
FIG. 15 schematically illustrates a vertical cross-sectional view of a package structure prepared by the method flow shown in FIG. 14 according to another embodiment of the present invention.

In other possible embodiments, as shown in FIG. 14, on the basis of the flow shown in FIG. 7, the method of manufacturing the chiplet-fine-interconnection-package structure further comprises an operation S27 of removing the plastic package layer which covers the second side surface of the substrate. FIG. 15 illustrates the package structure obtained after the process of operation S27, as shown in FIG. 15, the plastic package layer of the second side surface 1B of the substrate is removed, and the second side surface 1B of the substrate is completely exposed, the size of the entire package structure obtained is further reduced, and by exposing the second side surface of the substrate, when the substrate is made of a material with good thermal conductivity, the chip mounted on the substrate can dissipate heat through the substrate and the exposed second side surface to improve the heat dissipation performance of the package structure. It can be understood that, in other embodiments, the process of the operation S27 and/or operation S241 may also be added on the basis of the flow shown in FIG. 2 in the same manner as the embodiment shown in FIG. 7 to obtain the package structure in another embodiment.

The solutions provided by the embodiments of the present invention will be described below from the perspective of the structure of the package structure obtained in other embodiments.

Figure 16:
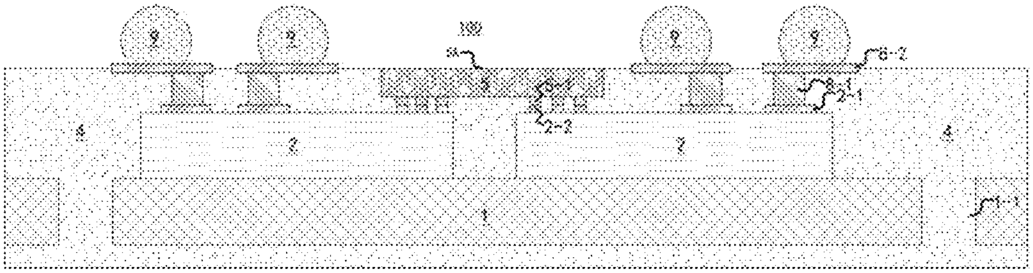
FIG. 16 schematically illustrates a vertical cross-sectional view of a chiplet-fine-interconnection-package structure according to yet another embodiment of the present invention.

FIG. 16 schematically illustrates a vertical cross-sectional view of the package structure 100 of other embodiment of the present invention, as shown in FIG. 16, the only difference from the embodiment shown in FIG. 1 is that, in the embodiments of the present invention, the build-up layer shown in FIG. 1 is not included, and the function of the build-up layer is replaced by a part of the plastic package layer, that is, in the embodiment shown in FIG. 16, the plastic package layer covers the substrate, the chip and the silicon bridge structure at the same time, the interconnect electrically connected with the second pin-array of the chip, i.e., the second interconnect referred to in the embodiments of the present invention, is arranged in the plastic package layer, and correspondingly, the fifth pin-array electrically connected with the second pin-array of the chip through the second interconnect is also arranged on the surface of the plastic package layer. Thus, in the package structure of the embodiments of the present invention, in addition to providing a fastening and protecting effect to the chip and the package structure, the plastic package layer is also used to fasten and protect the silicon bridge structure and also provides the interconnection structure for the external electrical connection of the second pin-array of the chip (including the second interconnect and the fifth pin-array).

Figure 17:
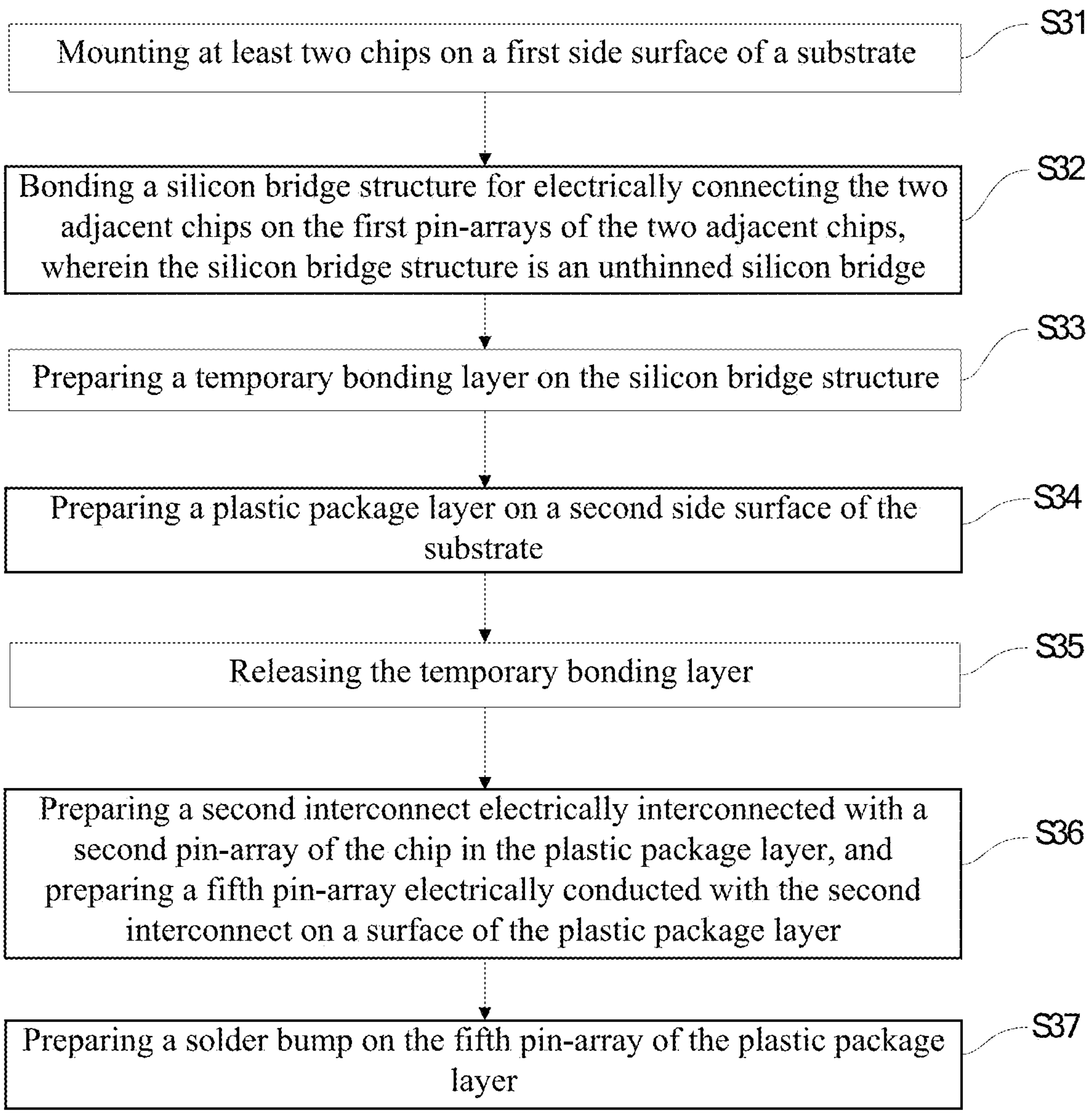
FIG. 17 schematically illustrates a flow chart of a method of manufacturing a chiplet-fine-interconnection-package structure according to another embodiment of the present invention.
Figure 18:
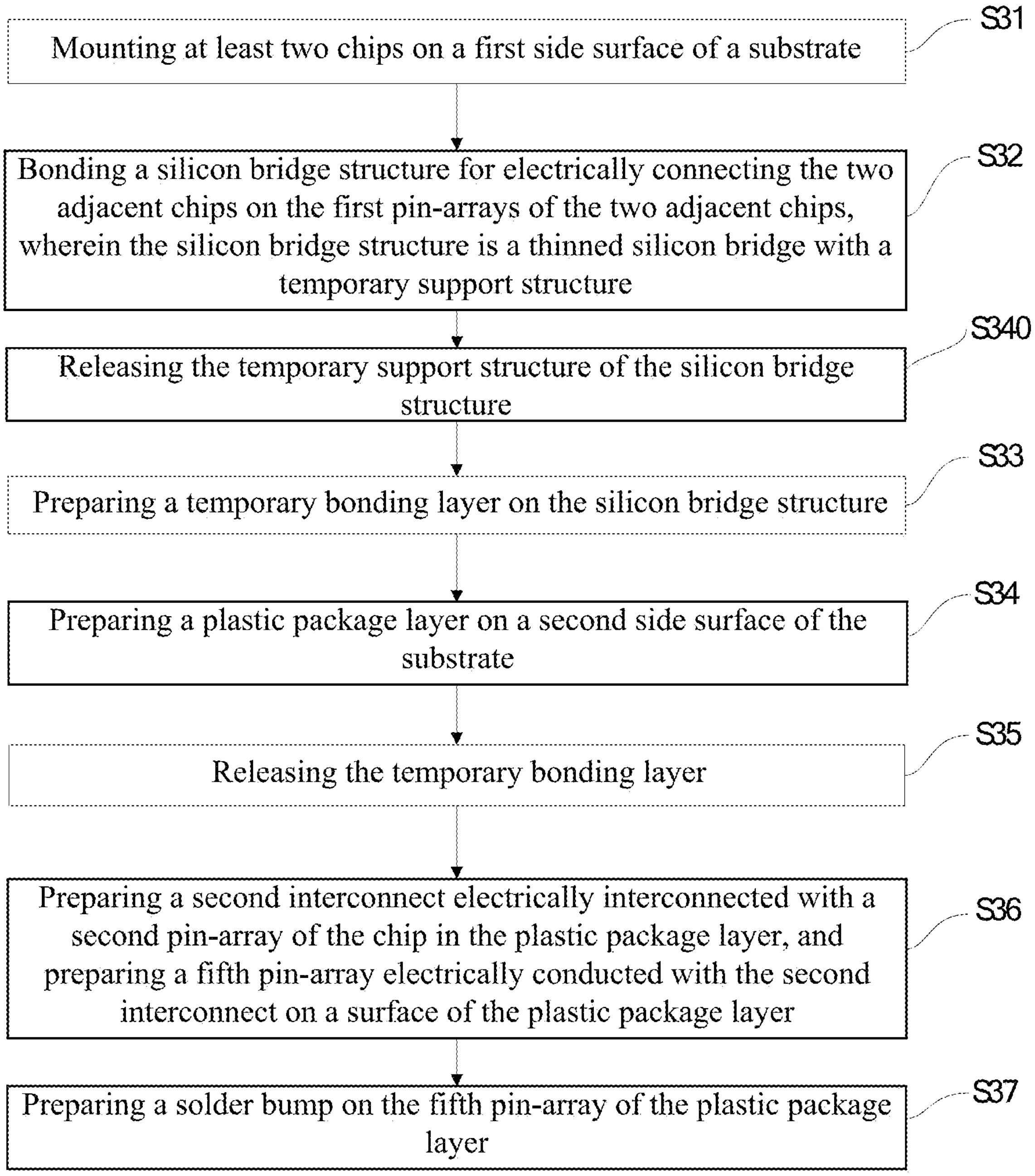
FIG. 18 schematically illustrates a flow chart of a method of manufacturing a chiplet-fine-interconnection-package structure according to yet another embodiment of the present invention.

The method of manufacturing the package structure shown in FIG. 16 will be described in detail below with reference to FIG. 17 to FIG. 22. FIG. 17 schematically illustrates a flow of the method of manufacturing the chiplet-fine-interconnection-package structure in some embodiments, FIG. 18 schematically illustrates a flow of the method of manufacturing the chiplet-fine-interconnection-package structure in some other embodiments, and FIG. 19 to FIG. 22 schematically illustrate the process of manufacturing the package structure with the above features by using the method shown in FIG. 18.

As shown in FIG. 17, the method of manufacturing the chiplet-fine-interconnection-package structure comprises an operation S31 of mounting at least two chips on a first side surface of a substrate, wherein the number of chips to be mounted and the selection of functions the selection of the substrate are the same as those of the embodiments shown in FIG. 2 and FIG. 7, so reference can be made to the previous description, and no further description will be repeated here.

Figure 19:
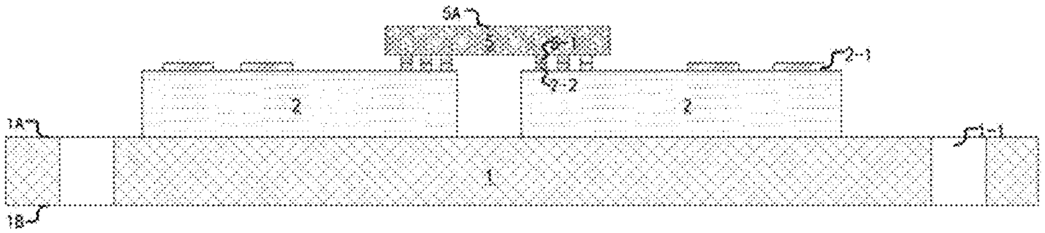
FIG. 19 schematically illustrates a vertical cross-sectional view of a package structure obtained after the processing in operation S340 shown in FIG. 18 according to one embodiment of the present invention.
Figure 20:
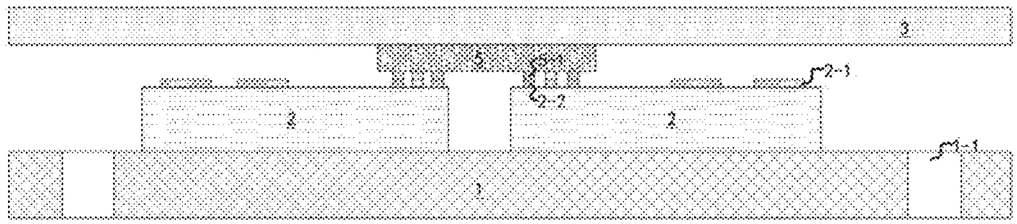
FIG. 20 schematically illustrates a vertical cross-sectional view of a package structure obtained after the processing in operation S33 shown in FIG. 18 according to some embodiments.
Figure 21:
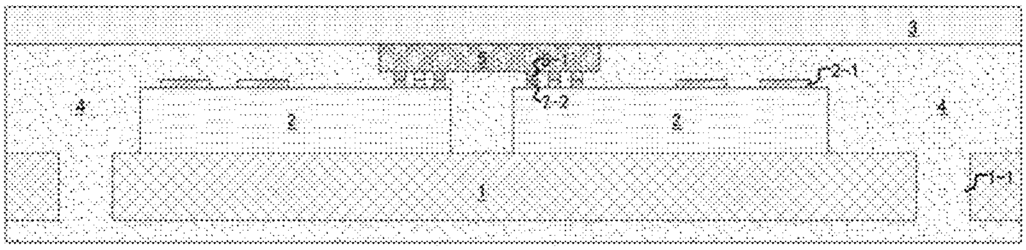
FIG. 21 schematically illustrates a vertical cross-sectional view of a package structure obtained after the processing in operation S34 shown in FIG. 18 according to some embodiments.
Figure 22:
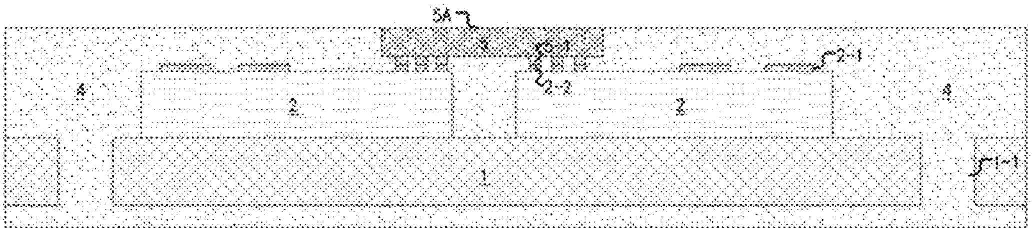
FIG. 22 schematically illustrates a vertical cross-sectional view of a package structure obtained after the processing in operation S35 shown in FIG. 18 according to some embodiments.

In some embodiments, as shown in FIG. 17, the method of manufacturing the chiplet-fine-interconnection-package structure comprises an operation S32 of bonding a silicon bridge structure for electrically connecting the two adjacent chips on the first pin-arrays of the two adjacent chips, and an operation S33 of preparing a temporary bonding layer on the silicon bridge structure. In the operations S32 and S33, the silicon bridge structure is an unthinned silicon bridge, so its specific processing is the same as the corresponding operation shown in FIG. 2 above, and the method of preparing the bonding layer is also the same as the above corresponding operation. Unlike the aforementioned manufacturing method, in the embodiment, the temporary bonding layer is prepared on the silicon bridge structure, that is, the preparation sequence of the silicon bridge structure and the temporary bonding layer is different from the aforementioned method shown in FIG. 2 and FIG. 7. Thus, in the operation S34 shown in FIG. 17, the prepared plastic package layer covers the substrate, the chip and the silicon bridge structure at the same time, and does not cover the surface of the silicon bridge structure opposite to the surface arranged with the fourth pin-array (the embodiment of the present invention is referred to as the first silicon bridge surface), and in the method shown in FIG. 17, it is no longer necessary to prepare the build-up layer, but as shown in operation S36, after the temporary bonding layer is released through S35, the second interconnect electrically interconnected with the second pin-array of the chip is directly prepared in the plastic package layer, and the fifth pin-array electrically conducted with the second interconnect is prepared on the surface of the plastic package layer. Thus, in the operation S37, the solder bumps are prepared on the fifth pin-array on the surface of the plastic package layer. Exemplarily, in the operation S36, holes can be made on the plastic package layer at the second pin-array to be exposed through a laser perforation process, a mechanical drilling process, or a plasma etching process, and then metallization can be performed on the inside of the holes by sputtering a seed layer and electroplating or by sintering the holes after filling the holes with nanomaterials to obtain the second interconnect of the vertical interconnection structure. It can be understood that a non-vertical interconnection structure or the second interconnect including the vertical interconnection structure and the non-vertical interconnection structure can also be prepared on the plastic package layer by the same process as the manufacturing method shown in FIG. 2 and FIG. 7. Different from FIG. 17, in other embodiments, the silicon bridge structure can also use the thinned silicon bridge, and thus, as shown in FIG. 18, on the basis of FIG. 17, FIG. 18 further comprises an operation S340 of releasing the temporary support structure of the silicon bridge structure, wherein the manufacturing method of the thinned silicon bridge and the manner of releasing the temporary support structure can refer to the description in the corresponding part above. FIG. 19 illustrates a vertical cross-sectional view of the package structure obtained after processing in the operation S340. As shown in FIG. 19, the fourth pin-array 5-1 of the thinned silicon bridge 5 is bonded to the first pin-array 2-2 of the chip, the plastic package layer has not been prepared at this time, and neither the substrate nor the chip is wrapped by the plastic package layer but is exposed. FIG. 20 illustrates a vertical cross-sectional view of the package structure obtained after preparing the temporary bonding layer in the operation S33. As shown in FIG. 20, the temporary bonding layer 3 is prepared on the thinned silicon bridge 5. FIG. 21 illustrates a vertical cross-sectional view of the package structure obtained after preparing the plastic package layer in the operation S34. As shown in FIG. 21, the plastic package layer 4 fills the space between the substrate and the temporary bonding layer 3 and covers the second side surface of the substrate. FIG. 22 illustrates a vertical cross-sectional view of the package structure obtained after releasing the temporary bonding layer in the operation S35. As shown in FIG. 22, the plastic package layer 4 does not cover the first silicon bridge surface 5A of the silicon bridge structure 5, that is, the first silicon bridge surface 5A is exposed, so there is no need to perform subsequent grinding and thinning treatment on the plastic package layer, and it allows the silicon bridge structure 5 to be separately prepared by a suitable process according to requirements. After preparing the solder bumps in operation S37 of FIG. 18, the package structure shown in FIG. 16 can be obtained. As shown in FIG. 16, the temporary bonding layer 3 has been removed, the first silicon bridge surface 5A of the silicon bridge structure 5 is not covered by the plastic package layer because it is protected by the temporary bonding layer, the second interconnect 8-1 is prepared in the plastic package layer 4, the fifth pin-array 8-2 is located on the surface of the plastic package layer 4, and the solder bumps are prepared at the fifth pin-array on the plastic package layer 4, which are electrically connected with the second pin-array of the chip through the fifth pin-array and the second interconnect. Different from the existing packaging process, since the embodiment of the present invention prepares the temporary bonding layer directly on the silicon bridge structure first, and then prepares the plastic package layer from the second side surface of the substrate through the microvias on the substrate, the plastic package layer is not wrapped on the first silicon bridge surface of the silicon bridge structure, that is, the surface of the silicon bridge structure attached to the temporary bonding layer is not wrapped by the plastic package layer due to the protection of the temporary bonding layer. Thus, in the subsequent process, the embodiments of the present invention do not need to perform grinding and thinning treatment on the plastic package layer, and such a manner also enables the silicon bridge structure to be separately prepared according to requirements, especially when the silicon bridge structure is the thinned silicon bridge, the thinned silicon bridge can be prepared separately through the process of the embodiments of the present invention, and at this time, only a small area of the silicon wafer can be thinned instead of a large area of the entire plastic package layer and the silicon bridge structure, which obviously simplifies the packaging process and reduces packaging costs.

In some embodiments, on the basis of the manufacturing methods shown in FIG. 17 and FIG. 18, underfilling may also be performed in the area below the silicon bridge structure between the silicon bridge structure and the chip before the preparation of the plastic package layer in operation S34.

Figure 23:
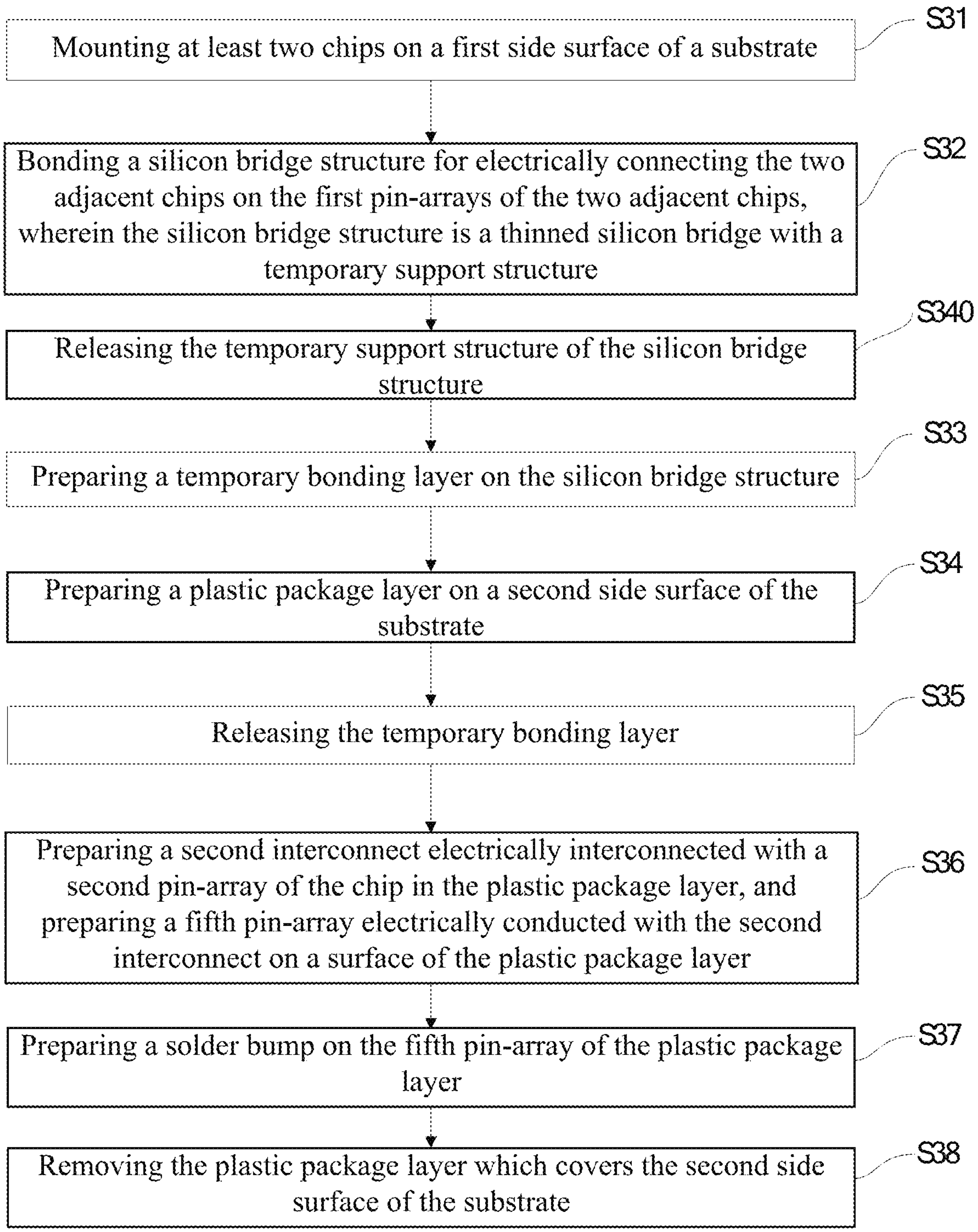
FIG. 23 schematically illustrates a flow chart of a method of manufacturing a chiplet-fine-interconnection-package structure according to yet another embodiment of the present invention.
Figure 24:
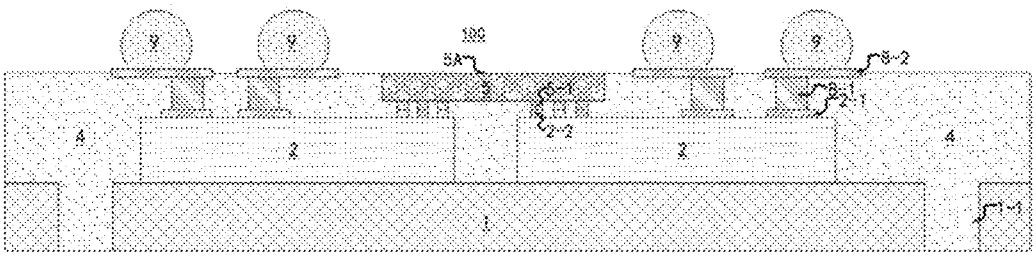
FIG. 24 schematically illustrates a vertical cross-sectional view of a package structure obtained after the processing shown in FIG. 23 according to some embodiments.

In some embodiments, as shown in FIG. 23, the method of manufacturing the chiplet-fine-interconnection-package structure further comprising an operation S38 of, on the basis of the flow shown in FIG. 18, removing the plastic package layer which covers the second side surface of the substrate and the package structure thus obtained is shown in FIG. 24, wherein the second side surface 1B of the substrate is completely exposed, the size of the entire package structure obtained is further reduced, and the heat dissipation of the chip mounted on the first side surface of the substrate can be facilitated, especially when the substrate is prepared with a material capable of conducting heat. It can be understood that, in other embodiments, the processing of the operation S38 may also be added on the basis of the flow shown in FIG. 17 to obtain the package structure in another embodiment.

Figure 27:
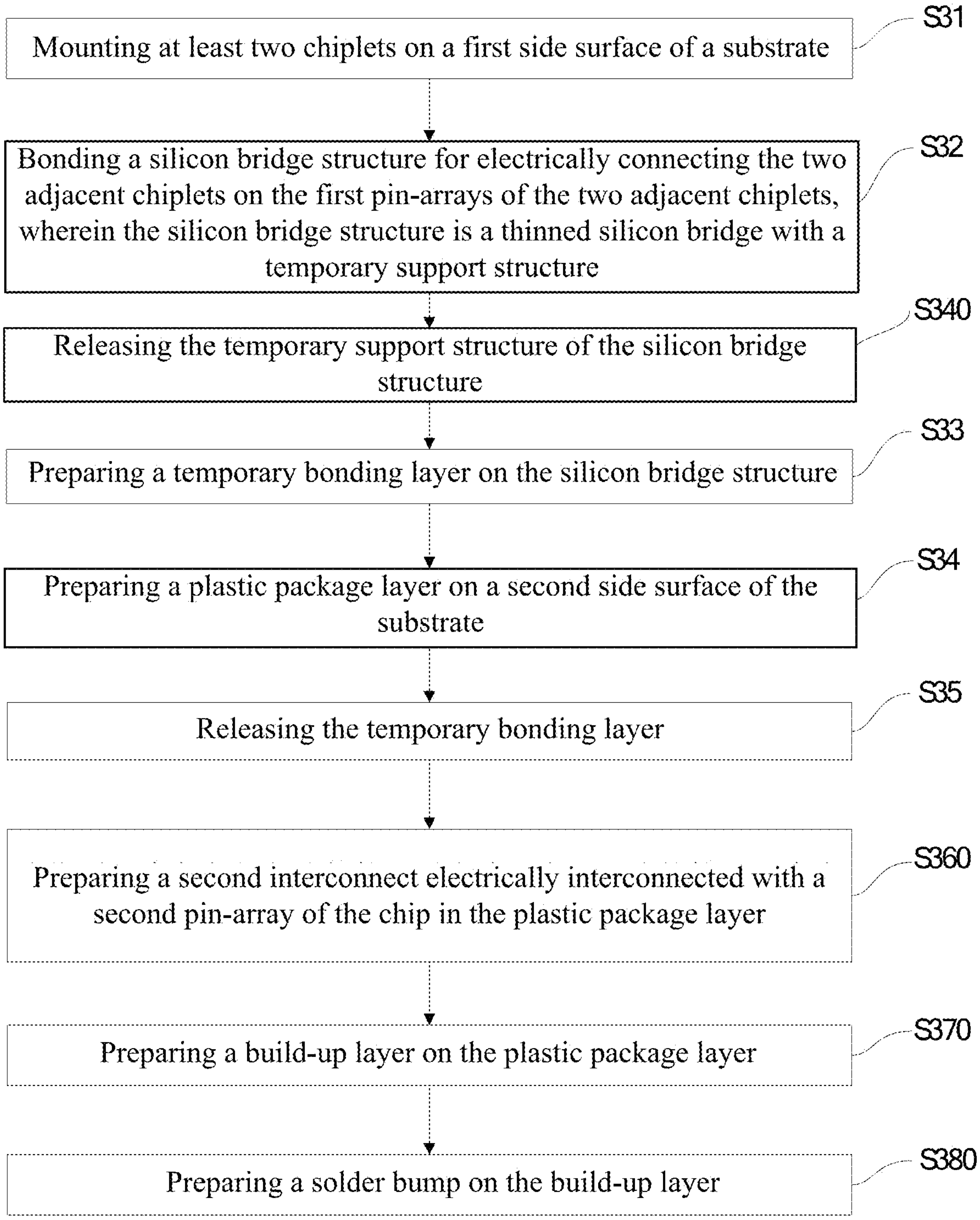
FIG. 27 schematically illustrates a flow chart of a method of manufacturing a chiplet-fine-interconnection-package structure according to a further embodiment of the present invention.
Figure 28:
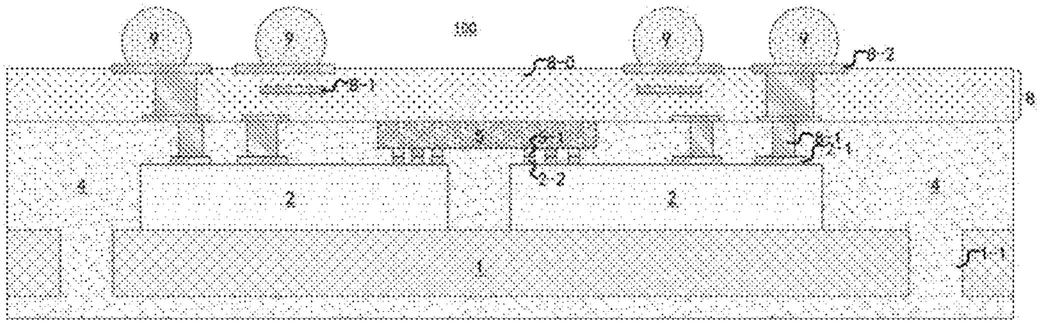
FIG. 28 schematically illustrates a vertical cross-sectional view of a chiplet-fine-interconnection-package structure manufactured based on the method shown in FIG. 27 according to one embodiment of the present invention.
Figure 29:
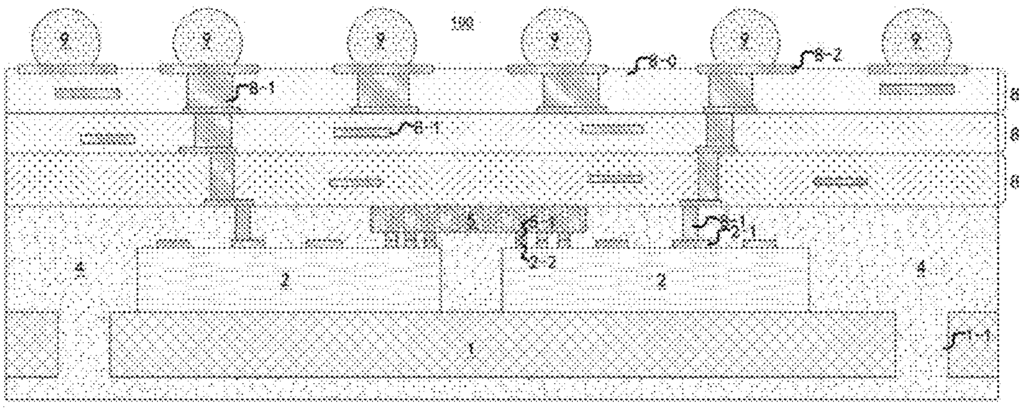
FIG. 29 schematically illustrates a vertical cross-sectional view of a chiplet-fine-interconnection-package structure manufactured based on the method shown in FIG. 27 according to another embodiment of the present invention.

In some other embodiments, after preparing the plastic package layer in the manner shown in FIG. 16 and FIG. 17 but before preparing the solder bumps, it is also possible to continue to prepare the build-up layer on the plastic package layer and prepare the solder bumps electrically connected with the second pin-array through the plastic package layer and the build-up layer on the build-up layer to obtain the package structure of another embodiment, wherein the package structure obtained is an improvement on the basis of the package structure shown in FIG. 16. FIG. 27 illustrates the manufacturing method of the package structure in this embodiment, and FIG. 28 and FIG. 29 illustrate different embodiments of the package structures manufactured by the method of FIG. 27. As shown in FIG. 27, taking the silicon bridge structure using the thinned silicon bridge as an example, the difference from FIG. 17 is that after the operation S35, it comprises an operation S360, and in the operation S360, unlike operation S36 of FIG. 17, the embodiment of the present invention only prepares the second interconnect electrically connected with the second pin-array of the chip in the plastic package layer and does not prepare the fifth pin-array on the plastic package layer. Afterwards, the manufacturing method shown in FIG. 27 is to continue to prepare the build-up layer on the surface of the plastic package layer through an operation S370, and finally prepare the solder bumps on the build-up layer through an operation S380, wherein the build-up layer prepared in the operation S370 is a single layer or multiple layers, and the manufacturing method and the features of each build-up layer are the same as those described above, and reference may be made to the foregoing description. Thus, in the embodiment of FIG. 27, in the operation S380, the solder bumps are prepared on the third pin-array on the outermost layer of the build-up layer, the third pin-array on the outermost layer of the build-up layer is electrically connected with the second pin-array of the chip through the first interconnect of each build-up layer and the second interconnect of the plastic package layer, that is, the solder bumps are connected to the second pin-array of the chip through the plastic package layer and the build-up layer, thereby further improving the fineness and interconnection density of the interconnects of the package structure. Taking the single layer and the triple layer of the prepared build-up layer as an example, FIG. 28 and FIG. 29 respectively illustrate the package structure in cases of the build-up layers with different numbers of layers. As shown in FIG. 28 and FIG. 29, since the temporary bonding layer is bonded on the silicon bridge structure during the manufacturing process, the plastic package layer thus obtained covers the substrate, the chip and the silicon bridge structure, and does not cover the first silicon bridge surface of the silicon bridge structure 5, that is, the first silicon bridge surface is exposed, and therefore, different from the manufacturing method based on FIG. 2 and FIG. 7, the innermost layer of the build-up layer prepared on the plastic package layer through operation S370 is attached to the first silicon bridge surface instead of wrapping the silicon bridge structure. It can be understood that, in other embodiments, the steps of the above-mentioned manufacturing method described in the embodiments of the present invention and the features of the package structure can also be freely combined in other manners according to requirements to obtain different types of package structures. The embodiments of the present invention are not to be regarded as limitations on the manner in which the steps of the manufacturing method and the features of the package structure may be combined.

Finally, it should be noted that: the above embodiments are only used to illustrate the technical solutions of the present application rather than limiting them; although the present application has been described in detail with reference to the foregoing embodiments, a person of ordinary skill in the art should understand that: it is still possible to modify the technical solutions described in the foregoing embodiments or perform equivalent replacements for some of the technical features, and these modifications or replacements do not deviate from the essence of the corresponding technical solutions of the various embodiments of the present application.

What is claimed is:

1. A method of manufacturing a chiplet-fine-interconnection-package structure, comprising:

mounting at least two chips on a first side surface of a substrate and preparing a temporary bonding layer covering a first surface of each one of the at least two chips, wherein the first surface of each chip includes a first pin-array having a first spacing and a second pin-array having a second spacing;

preparing a plastic package layer on a second side surface of the substrate, wherein the substrate is prepared with microvias to allow plastic package materials of the plastic package layer to flow from the microvias into an area between the first side surface of the substrate and the temporary bonding layer to prepare the plastic package layer which covers the substrate and the chips;

releasing the temporary bonding layer, and bonding a silicon bridge structure for electrically connecting the two adjacent chips on the first pin-arrays of the two adjacent chips, so that the plastic package layer covers both the substrate and the chip without covering a first surface of the chip and the silicon bridge structure; and preparing a build-up layer on the plastic package layer and preparing a solder bump on the build-up layer such that the solder bump is electrically connected with the second pin-array through the build-up layer.

2. The method as claimed in claim 1, further comprising: preparing an underfill in an area below each silicon bridge structure prior to preparing the build-up layer.

3. The method as claimed in claim 2, further comprising: removing the plastic package layer which covers the second side surface of the substrate.

4. The method as claimed in claim 2, wherein the silicon bridge structure is a thinned silicon bridge with a temporary support structure, and the method further comprises: releasing the temporary support structure of the silicon bridge structure after the silicon bridge structure is bonded to the first pin-arrays of the two adjacent chips.

5. The method as claimed in claim 4, wherein the thinned silicon bridge is manufactured by:

fastening a silicon wafer having a first thickness to the temporary support structure through a temporary adhesive material;

performing a thinning process on the silicon wafer having the first thickness fastened on the temporary support structure; and preparing a fourth pin-array which is provided to bond the first pin-array of the chip and fine lines which is provided to electrically conduct with the fourth pin-array on the thinned silicon wafer such that the thinned silicon bridge with the temporary support structure is formed.

6. The method as claimed in claim 1, wherein the build-up layer is a single layer or multiple layers, wherein each build-up layer includes a first insulating material and a first interconnect formed in the first insulating material, and the outermost layer of the build-up layer further includes a third pin-array arranged on a surface of the first insulating material, the third pin-array is electrically connected to the second pin-array through the first interconnect, and the solder bump is prepared on the third pin-array.

7. A method of manufacturing a chiplet-fine-interconnection-package structure, comprising:

mounting at least two chips on a first side surface of a substrate, wherein each chip includes a first pin-array having a first spacing and a second pin-array having a second spacing;

bonding a silicon bridge structure for electrically connecting the two adjacent chips on the first pin-arrays of the two adjacent chips;

preparing a temporary bonding layer on the silicon bridge structure;

preparing a plastic package layer on a second side surface of the substrate, wherein the substrate is prepared with microvias to allow plastic package materials of the plastic package layer to flow from the microvias into an area between the first side surface of the substrate and the temporary bonding layer to prepare the plastic package layer which covers the substrate, the chips and the silicon bridge structure without covering a first silicon bridge surface of the silicon bridge structure;

releasing the temporary bonding layer; and preparing on the plastic package layer a solder bump electrically connected with the second pin-array through the plastic package layer, or preparing a build-up layer on the plastic package layer and preparing the solder bump electrically connected with the second pin-array through the plastic package layer and the build-up layer on the build-up layer.

8. The method as claimed in claim 7, further comprising: removing the plastic package layer which covers the second side surface of the substrate.

9. The method as claimed in claim 7, wherein the silicon bridge structure is a thinned silicon bridge with a temporary support structure, and the method further comprises: releasing the temporary support structure of the silicon bridge structure after the silicon bridge structure is bonded to the first pin-arrays of the two adjacent chips.

10. The method as claimed in claim 9, wherein the thinned silicon bridge is manufactured by:
- fastening a silicon wafer having a first thickness to the temporary support structure through a temporary adhesive material;
- performing a thinning process on the silicon wafer having the first thickness fastened on the temporary support structure; and
- preparing a fourth pin-array which is provided to bond the first pin-array of the chip and fine lines which is provided to electrically conduct with the fourth pin-array on the thinned silicon wafer such that the thinned silicon bridge with the temporary support structure is formed.

11. The method as claimed in claim 7, wherein said preparing on the plastic package layer a solder bump electrically connected with the second pin-array through the plastic package layer includes:
- preparing a second interconnect electrically interconnected with the second pin-array of the chip in the plastic package layer, and preparing a fifth pin-array electrically conducted with the second interconnect on a surface of the plastic package layer; and
- preparing the solder bump on the fifth pin-array of the plastic package layer.

12. The method as claimed in claim 7, wherein said preparing a build-up layer on the plastic package layer and preparing the solder bump electrically connected with the second pin-array through the plastic package layer and the build-up layer on the build-up layer includes:
- preparing a second interconnect electrically interconnected with the second pin-array of the chip in the plastic package layer, and preparing the build-up layer on the surface of the plastic package layer, wherein the build-up layer prepared is a single layer or multiple layers, and each build-up layer includes a first insulating material and a first interconnect formed in the first insulating material;
- preparing a third pin-array on a surface of the first insulating material located in the outermost layer of the build-up layer, wherein the third pin-array is electrically connected to the second pin-array through the first interconnect and the second interconnect; and
- preparing the solder bump on the third pin-array on the outermost layer of the build-up layer.

13. A chiplet-fine-interconnection-package structure manufactured by the methods as claimed in claim 7, comprising:
- a substrate;
- at least two chips attached to a first side surface of the substrate, wherein each chip includes a first pin-array having a first spacing and a second pin-array having a second spacing;
- a plastic package layer;
- a silicon bridge structure bonded on the first pin-arrays of the two adjacent chips;
- a build-up layer disposed on the plastic package layer; and
- a solder bump arranged on the build-up layer, wherein the solder bump is electrically connected to the second pin-array through the build-up layer and the plastic package layer;
- wherein, the plastic package layer covers the substrate, the chip and the silicon bridge structure without covering a first silicon bridge surface of the silicon bridge structure.

14. The package structure as claimed in claim 13, wherein the build-up layer is a single layer or multiple layers, each build-up layer includes a first insulating material and a first interconnect formed in the first insulating material, and the outermost layer of the build-up layer further includes a third pin-array arranged on the surface of the first insulating material, the third pin-array is electrically connected to the second pin-array through the first interconnect, and the solder bump is arranged on the third pin-array.

15. The package structure as claimed in claim 14, wherein the plastic package layer includes the plastic package material and a second interconnect which is formed in the plastic package material and electrically interconnected with the second pin-array of the chip, the innermost layer of the build-up layer is attached to the first silicon bridge surface of the silicon bridge structure and the plastic package layer, and the first interconnect is electrically connected to the second pin-array through the second interconnect.

16. The package structure as claimed in claim 15, wherein the substrate is prepared using a thermal conductivity material such as copper, and a second side surface of the substrate is not covered by the plastic package layer, or both the first side surface and the second side surface of the substrate are covered by the plastic package layer.

17. The package structure as claimed in claim 15, wherein the substrate is prepared using a thermal conductivity material such as copper, and a second side surface of the substrate is not covered by the plastic package layer, or both the first side surface and the second side surface of the substrate are covered by the plastic package layer.

18. A chiplet-fine-interconnection-package structure manufactured by the methods as claimed in claim 1, comprising:
- a substrate;
- at least two chips attached to a first side surface of the substrate, wherein each chip includes a first pin-array having a first spacing and a second pin-array having a second spacing;
- a silicon bridge structure bonded on the first pin-arrays of the two adjacent chips;
- a plastic package layer;
- a build-up layer disposed on the plastic package layer; and
- a solder bump arranged on the build-up layer, wherein the solder bump is electrically connected to the second pin-array through the build-up layer;
- wherein the plastic package layer covers both the substrate and the chip without covering a first surface of the chip and the silicon bridge structure.

19. The package structure as claimed in claim 18, wherein the silicon bridge structure is covered by the innermost layer of the build-up layer.

20. The package structure as claimed in claim 18, further comprising:
- an underfill in an area below the silicon bridge structure, wherein the underfill is prepared using the same material as the plastic package layer or the first insulating material of the build-up layer, or the underfill is prepared using a different material from the plastic package layer and the first insulating material of the build-up layer.

* * * * *